United States Patent
Tonomura et al.

(10) Patent No.: US 7,364,965 B2
(45) Date of Patent: Apr. 29, 2008

(54) SEMICONDUCTOR DEVICE AND METHOD OF FABRICATION

(75) Inventors: Osamu Tonomura, Kokubunji (JP); Hiroshi Miki, Tokyo (JP); Yuichi Matsui, Koganei (JP); Tomoko Sekiguchi, Hino (JP); Kikuo Watanabe, Sayama (JP)

(73) Assignee: Hitachi, Ltd., Tokyo (JP)

( * ) Notice: Subject to any disclaimer, the term of this patent is extended or adjusted under 35 U.S.C. 154(b) by 162 days.

(21) Appl. No.: 10/986,497

(22) Filed: Nov. 12, 2004

(65) Prior Publication Data
US 2005/0142742 A1 Jun. 30, 2005

(30) Foreign Application Priority Data
Nov. 17, 2003 (JP) ............... 2003-386202

(51) Int. Cl.
*H01L 21/8242* (2006.01)
(52) U.S. Cl. ............ 438/243; 438/386; 438/387; 257/301
(58) Field of Classification Search ........ 438/243, 438/386–387; 257/301
See application file for complete search history.

(56) References Cited

U.S. PATENT DOCUMENTS 5,926,717 A * 7/1999 Michael et al. ............ 438/387
6,417,537 B1 * 7/2002 Yang et al. ................ 257/310
6,617,248 B1 * 9/2003 Yang ......................... 438/686
2005/0263858 A1 * 12/2005 Katsumata et al. ........ 257/649

FOREIGN PATENT DOCUMENTS

JP 2001-230247 8/2001

\* cited by examiner

*Primary Examiner*—Theresa T Doan
(74) *Attorney, Agent, or Firm*—Mattingly, Stanger, Malur & Brundidge, PC

(57) ABSTRACT

A semiconductor device having a DRAM has a capacitor in which a dielectric film and an upper electrode are laminated on a lower electrode comprising a polysilicone, in which a natural oxide film oxidized by oxygen in the atmosphere grows to at least 1.5 nm on the surface of a lower electrode of the capacitor. Further, in forming the dielectric film, the dioxide film further grows in the case of using an oxidative raw material. This brings forth a reduction in capacitance, and an increase of a leakage current is caused.

Therefore, after a dielectric film having a reduction property has been formed, the reduction property is promoted by a heat treatment to thereby reduce a dioxide film and realize making the dioxide film on the lower electrode surface thinner.

12 Claims, 22 Drawing Sheets

SEMICONDUCTOR DEVICE AND METHOD OF FABRICATION

The present application claims priority from Japanese application JP 2003-386202, filed on Nov. 17, 2003, the content of which is hereby incorporated by reference into this application.

BACKGROUND OF THE INVENTION

1. Field of the Invention

The present invention relates to a semiconductor device and method of fabrication, and particularly to the technology that is effective of being applied to a semiconductor device having a DRAM (Dynamic Random Access Memory).

2. Description of Related Art

A DRAM is formed by arranging memory cells on a semiconductor substrate in a matrix manner. A memory cell includes a selective transistor and an information accumulation device (hereinafter referred to as a capacitor) connected thereto. In order to form a large capacity of DRAM, it is necessary to make the capacitance of the memory cell capacitor into high density. The art for the purpose as described uses a capacitor made of a dielectric material having a large dielectric constant. A silicone is used for a lower electrode. It is known that when this silicon is heated in an oxidative atmosphere during formation of an insulator, a dioxide silicon film is grown on the surface thereof to bring forth reduction in capacitance. As a method for preventing the growth of the dioxide film, for example, Japanese Patent Laid-open No. 2001-230241 discloses a method comprising the steps of introducing a material having a reducing action when a dielectric film is produced, and bringing about a chemical reaction in a reactor to form a high dielectric gate insulating film made of a metallic dioxide film on the semiconductor substrate. According to this conventional art, it is possible to completely prevent formation of the dioxide silicon film.

The inventors have studied the aforementioned DRAM capacitor relative to a semiconductor device having a large capacity such as a 1-Gbit DRAM.

The capacitor capacity accumulated in a capacitor per bit needs an amount more than a fixed value in order to prevent a soft error and read error. Suppose that an aspect ratio of a storage node is constant, it is necessary to make the capacitor dielectric film thinner in order to meet a demand for increased capacitance resulting from scaling. In general a film thickness converted to a dioxide silicon film of relative dielectric constant –3.9 is used as an index of density of capacitor capacity. Generally, the capacitor capacity of a DRAM requires an amount more than 20 fF per bit, which corresponds to that for a converted film thickness of as extremely thin as about –3 mm in the case of a high integration memory such as a 1-Gbit DRAM. However, in such a thin thickness region, a tunneling leakage current as a direct leakage current is predominant, and a leakage current increases exponentially with the reduction in physical film thickness. When the leakage current increases, the time till information once stored is lost becomes short to impair a high-speed operation. Therefore, there has been adopted a high dielectric constant material capable of making a physical film thickness large with the converted film thickness being small, and capable of directly minimizing a tunneling leakage current.

Further, the formation of such a thin insulator involves a critical problem with an interfacial formation of a high dielectric constant-film and a lower electrode. Since phosphorus is added with high concentration to polysilicon used for a lower electrode, a natural oxide film grows far faster than a normal single-crystal substrate. Therefore, it has been found that even if the technology is used in which an oxide film is not formed on the surface during the formation of an insulator, it is oxidized by oxygen in the atmosphere during conveyance between apparatuses, and a natural film oxide has been already formed on the surface. According to the studies of the inventors, it was impossible to make a natural film oxide less than 1.5 nm because of the fast oxidization of polysilicon. Further, in the subsequent step of forming a dielectric film, where an oxidative raw material is used, the growth of film oxide further progresses. Since having a dielectric constant of as low as 3.9, even the oxide film that has a film thickness of as thin as 1.5 nm greatly deteriorates the capacitance thereof. In order to increase the capacitance it is necessary to reduce the natural oxide film thickness and increase a film thickness of a material having a large dielectric constant.

SUMMARY OF THE INVENTION

It is an object of the present invention to remove a dioxide film, which is low in dielectric constant and causes an increased leakage current, on a poly-silicon film demanded by such a fine semiconductor device.

The semiconductor device according to the present invention having a capacitor including a lower electrode, a dioxide film formed on the surface the lower electrode, and a dielectric film in contact with the dioxide film. The dioxide film is a natural dioxide film formed during conveyance between apparatuses, or a dioxide film formed by an oxidative raw material when a dielectric film is formed. In order to reduce a film thickness of the natural dioxide film, the present invention mainly uses $Al_2O_3$ as a dielectric film. An atomic layer deposition is used to form a dielectric film. In this case, in particular at the initial time of forming an insulator, the pulse time or flow rate of an oxidizing agent is reduced intentionally to deposit a dielectric film having a reduction property. Further, it is characterized in that after formation of the dielectric film, a heat treatment at approximately 800° C. is carried out in an inert gas or oxygen or nitrous oxide to thereby promote the reduction action of the dielectric film and reduce the dioxide film on the surface of a lower electrode.

An effect of the capacitor formed by applying the present invention will be explained in detail with reference to FIG. 1. A natural dioxide film of approximately 1.5 nm is grown in about 10 minutes after formation of poly-silicon of a lower electrode. The dioxide film is further grown at the time of forming a dielectric film using an oxidative raw material. Therefore, in the prior art, a natural dioxide film in excess of 1.5 nm is present on the surface of a lower electrode. However, a heat treatment is carried out on the dielectric film having a reduction property whereby the reduction property of a dielectric film is promoted, and the thickness of the natural dioxide film is reduced. As a result, the natural dioxide film having a thickness of less than 1.5 mm that cannot be achieved by the prior art can be achieved. The detail of these execution methods will become apparent in the ensuing embodiments.

According to the present invention, there is configured a capacitor exhibiting sufficient capacitance and a low leakage current while being made fine, whereby a semiconductor device of large capacity, particularly a DRAM can be provided.

DESCRIPTION OF THE PREFERRED EMBODIMENTS

Embodiment 1

Figure 1:
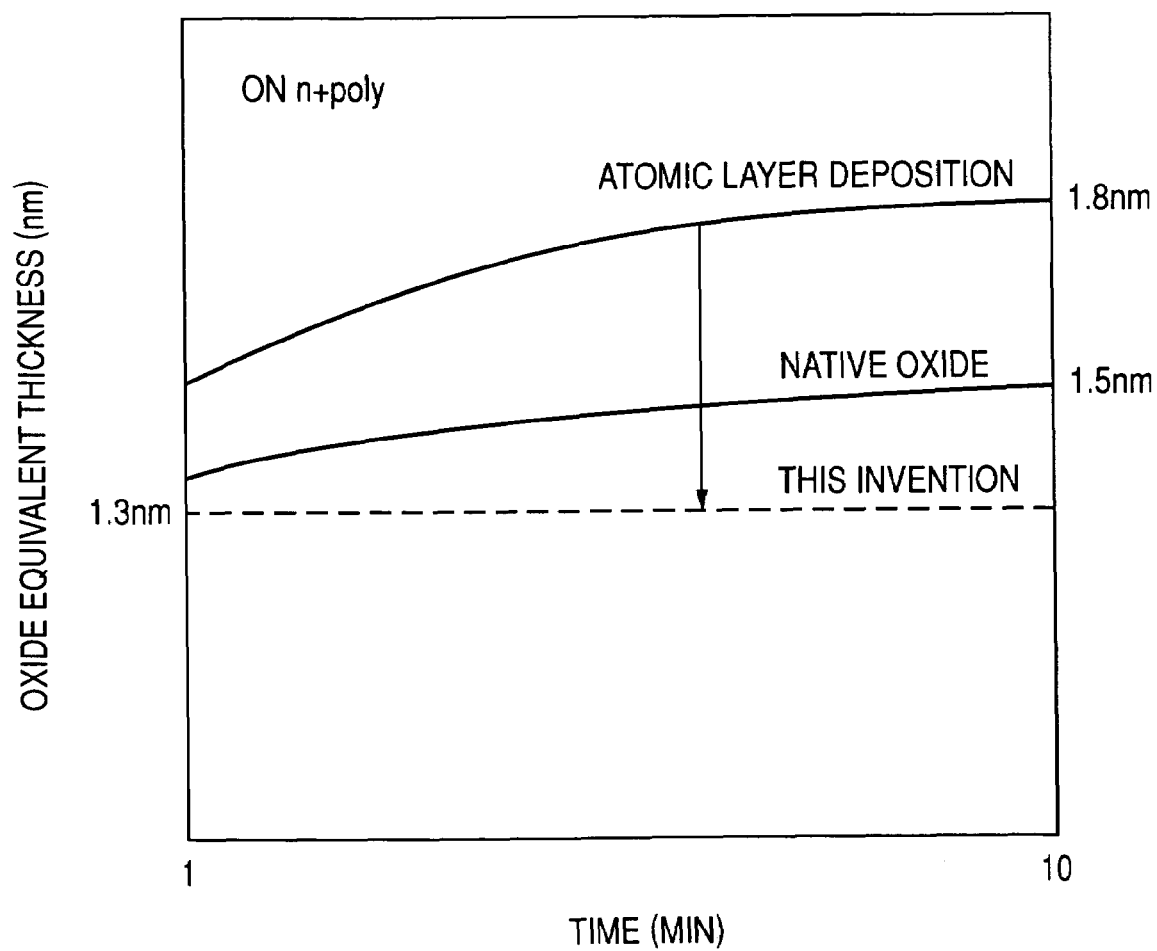
FIG. 1 is a conceptual diagram for explanation of making a thickness of a natural dioxide film thinner according to the present invention.
Figure 9:
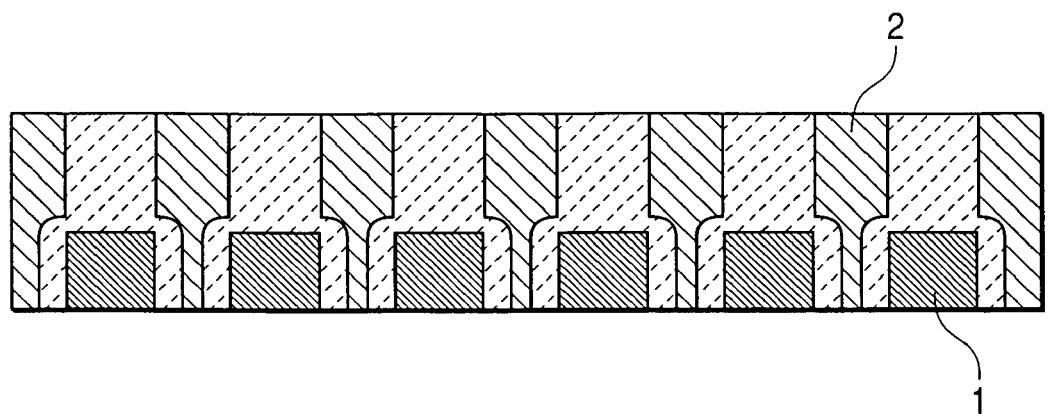
FIG. 9 is a cross-sectional construction view of a DRAM memory cell portion prepared according to Embodiment 1 of the present invention.
Figure 10:
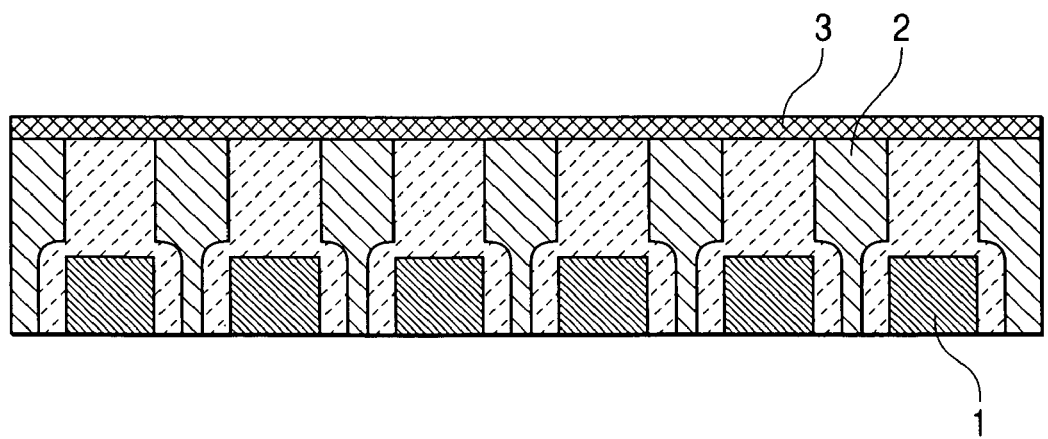
FIG. 10 is a cross-sectional construction view of a DRAM capacitor portion prepared according to Embodiment 1 of the present invention.
Figure 11:
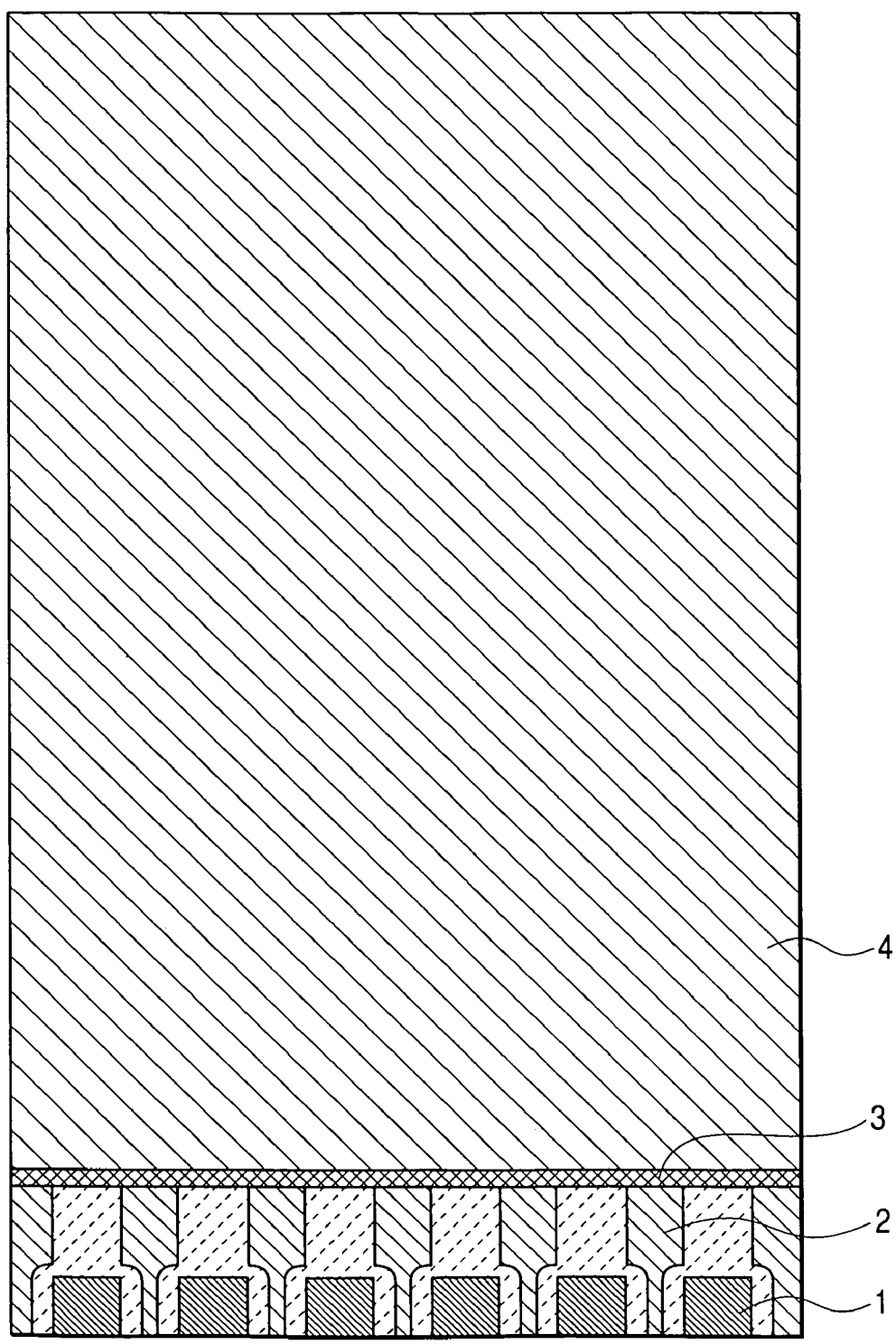
FIG. 11 is a cross-sectional construction view of a DRAM capacitor portion prepared according to Embodiment 1 of the present invention.
Figure 12:
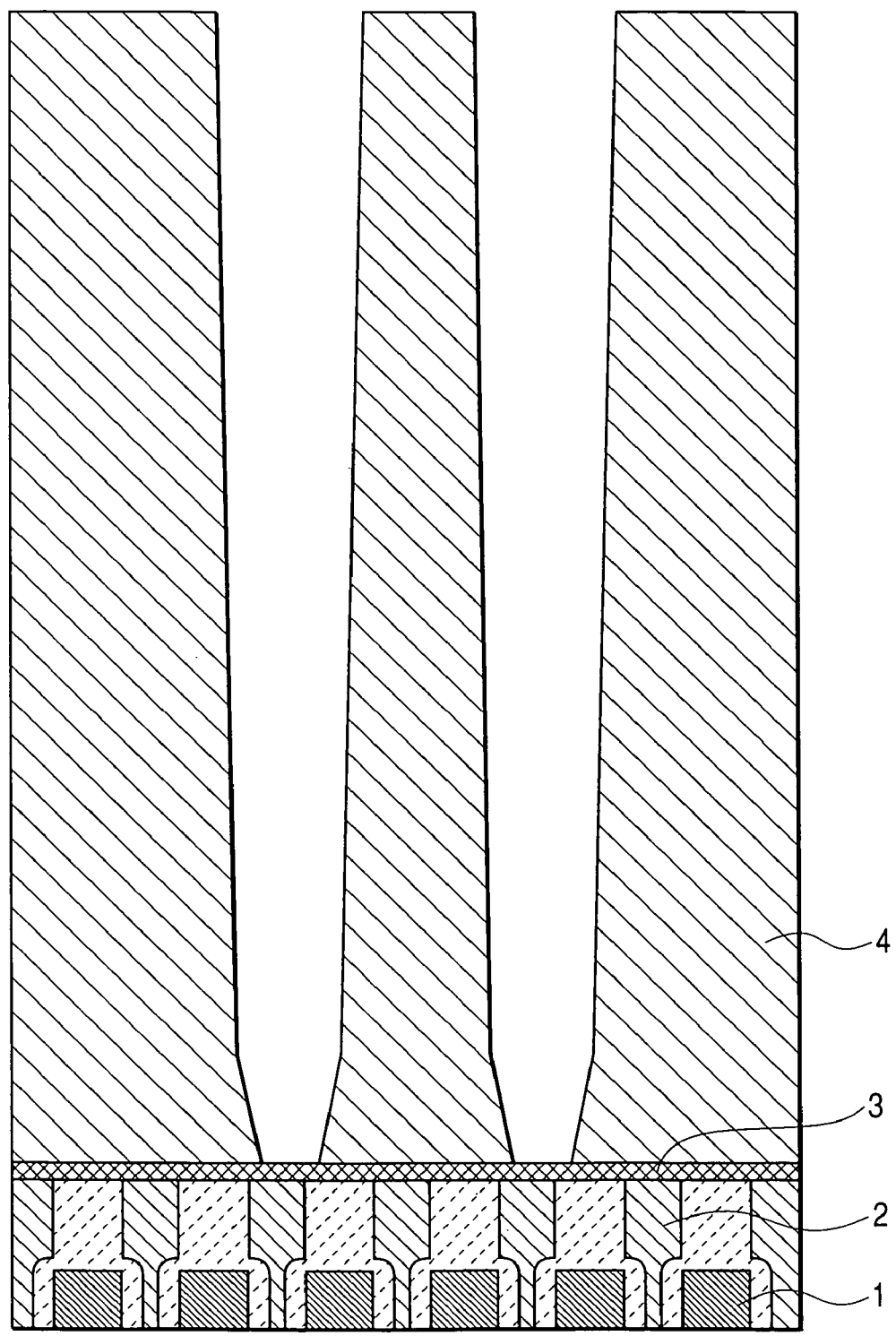
FIG. 12 is a cross-sectional construction view of a DRAM capacitor portion prepared according to Embodiment 1 of the present invention.
Figure 13:
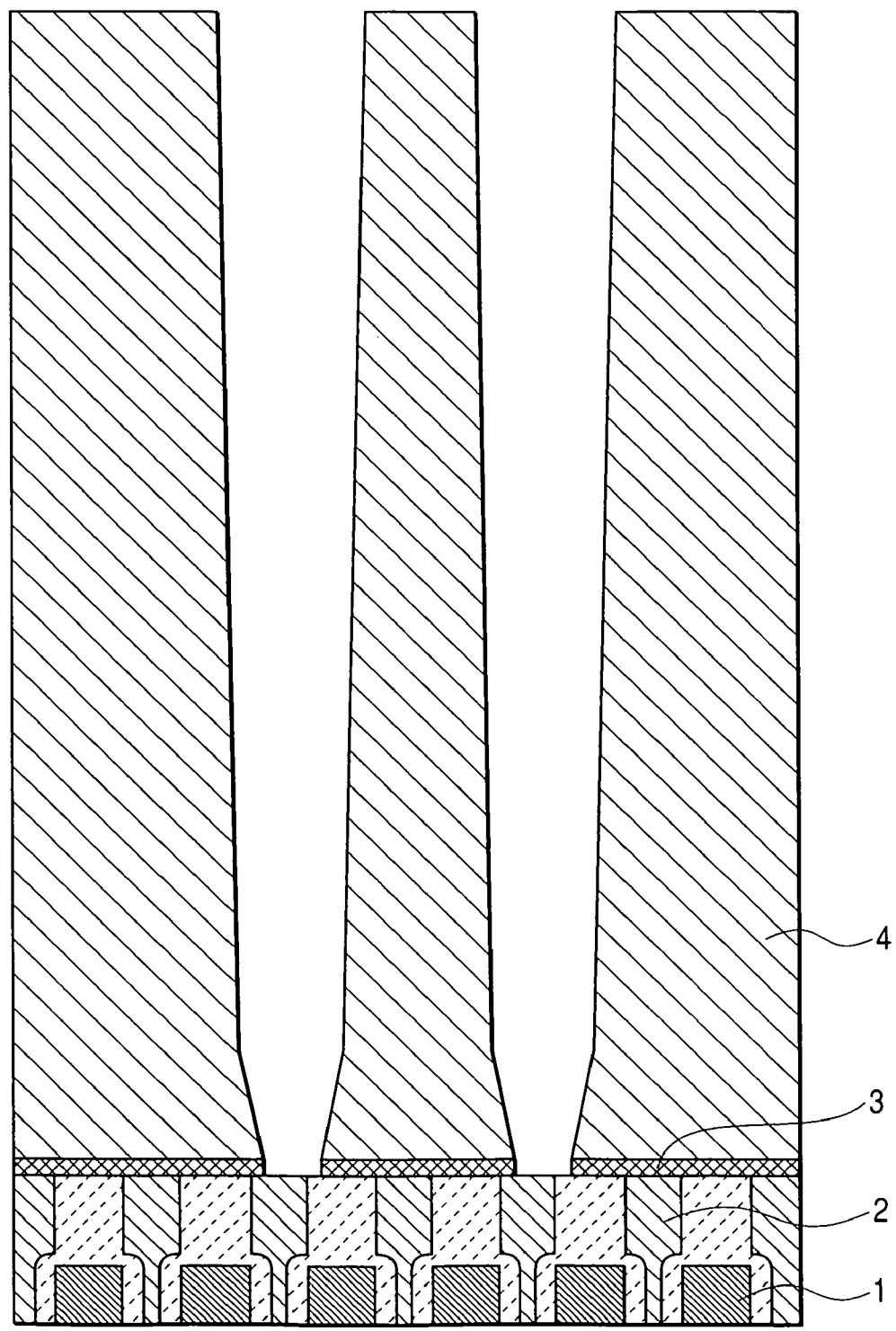
FIG. 13 is a cross-sectional construction view of a DRAM capacitor portion prepared according to Embodiment 1 of the present invention.

The present embodiment discloses a method of fabricating a memory capacitor of a DRAM having a capacitor according to the present invention. Bit lines 1 are formed on a memory cell selective transistor formed by a known method, and poly-silicon plugs 2 for electrically connecting a selective transistor with a capacitor is formed as shown in FIG. 9. A nitride silicon film 3 having a film thickness of about 100 nm is deposited thereon by a CVD method as shown in FIG. 10 to serve as an etching stopper when a silicon dioxide film is processed. Subsequently, as shown in FIG. 1, a silicon dioxide film 4 of which raw material is tetraetoxysilane is formed on a nitride silicon film. The silicon dioxide film is processed by a dry etching method with a photo-resist used as a mask as shown in FIG. 12. Further, dry etching is continuously carried out on the nitride silicon to form grooves for lower electrodes above the poly-silicon plugs as shown in FIG. 13.

Figure 2:
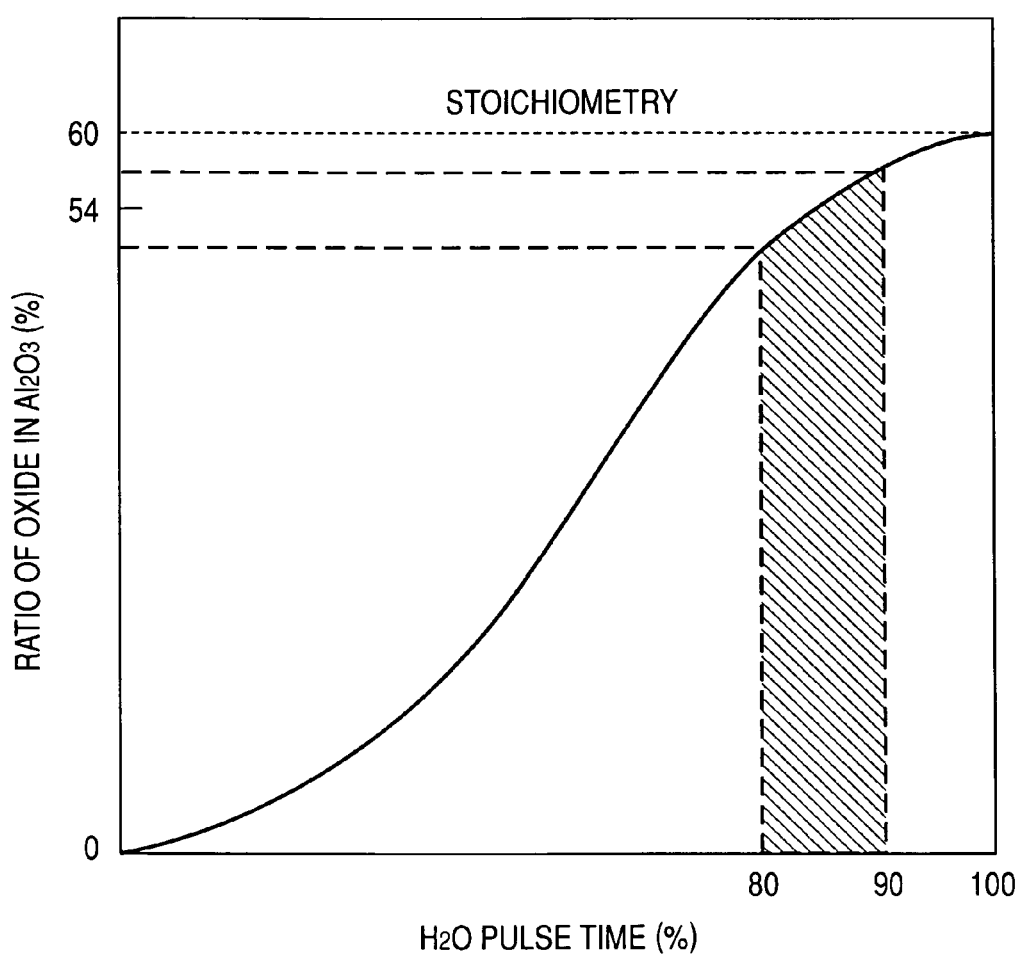
FIG. 2 shows a relationship between a ratio of oxygen in $Al_2O_3$ and $H_2O$ pulse time.
Figure 3:
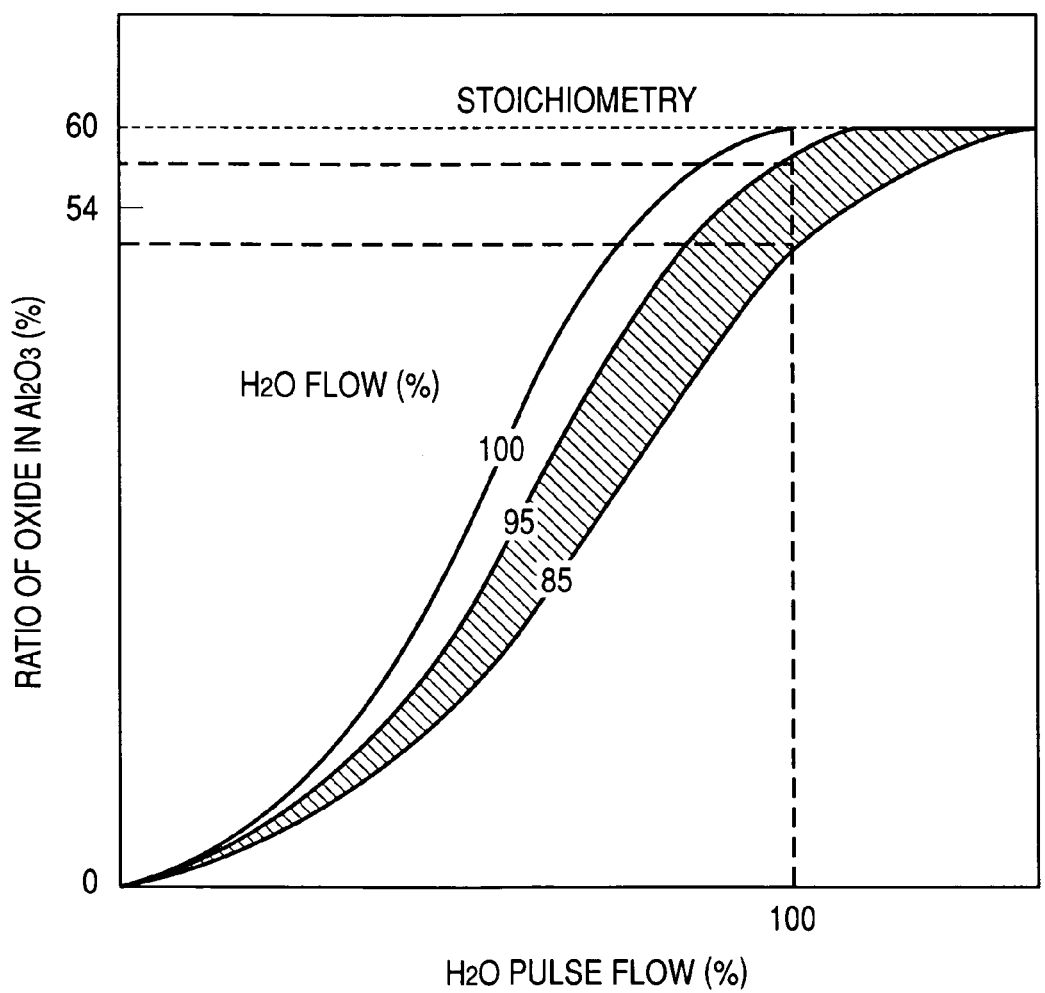
FIG. 3 shows a relationship between a ratio of oxygen in $Al_2O_3$ and $H_2O$ pulse time.
Figure 14:
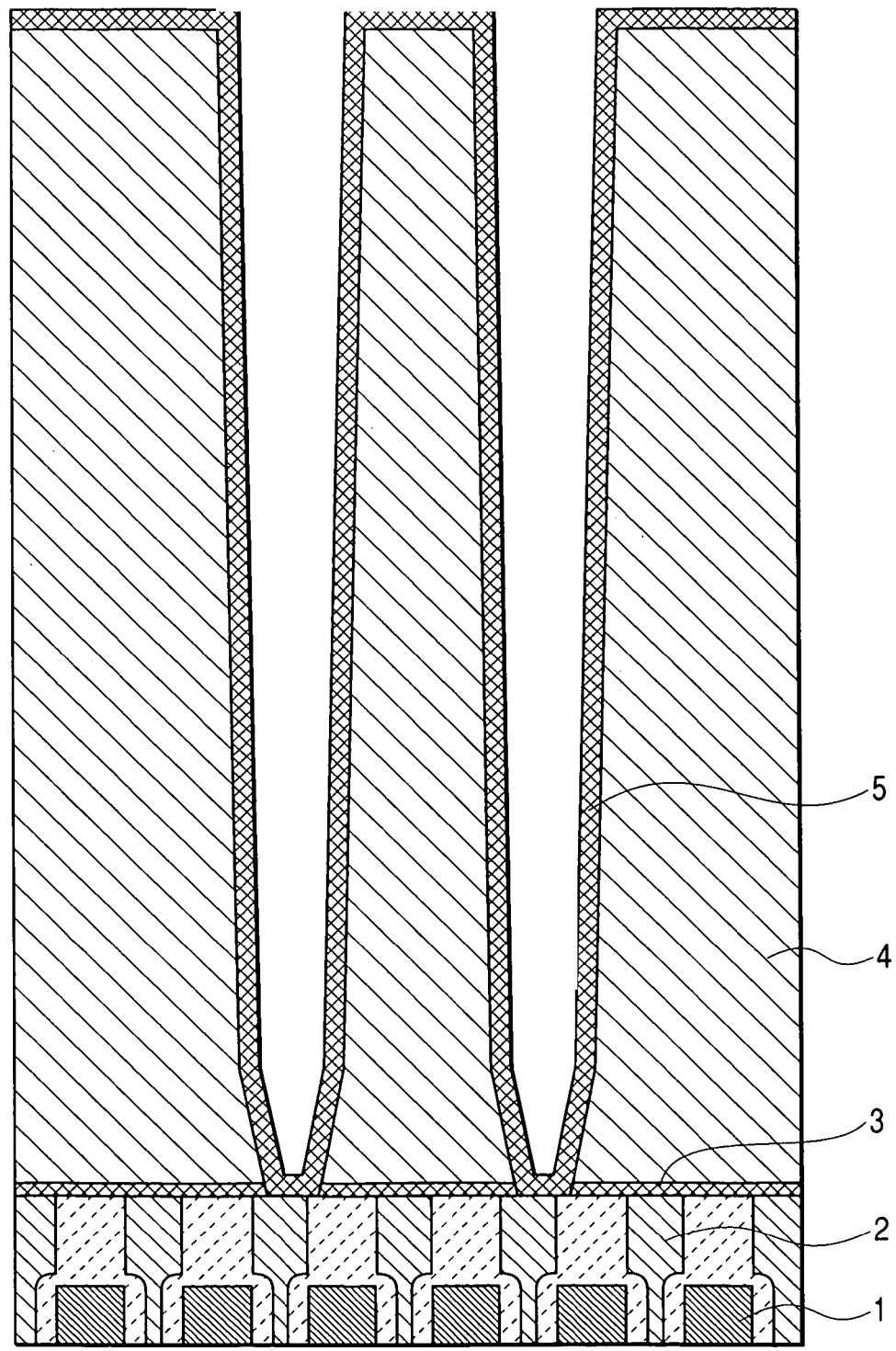
FIG. 14 is a cross-sectional construction view of a DRAM capacitor portion prepared according to Embodiment 1 of the present invention.
Figure 15:
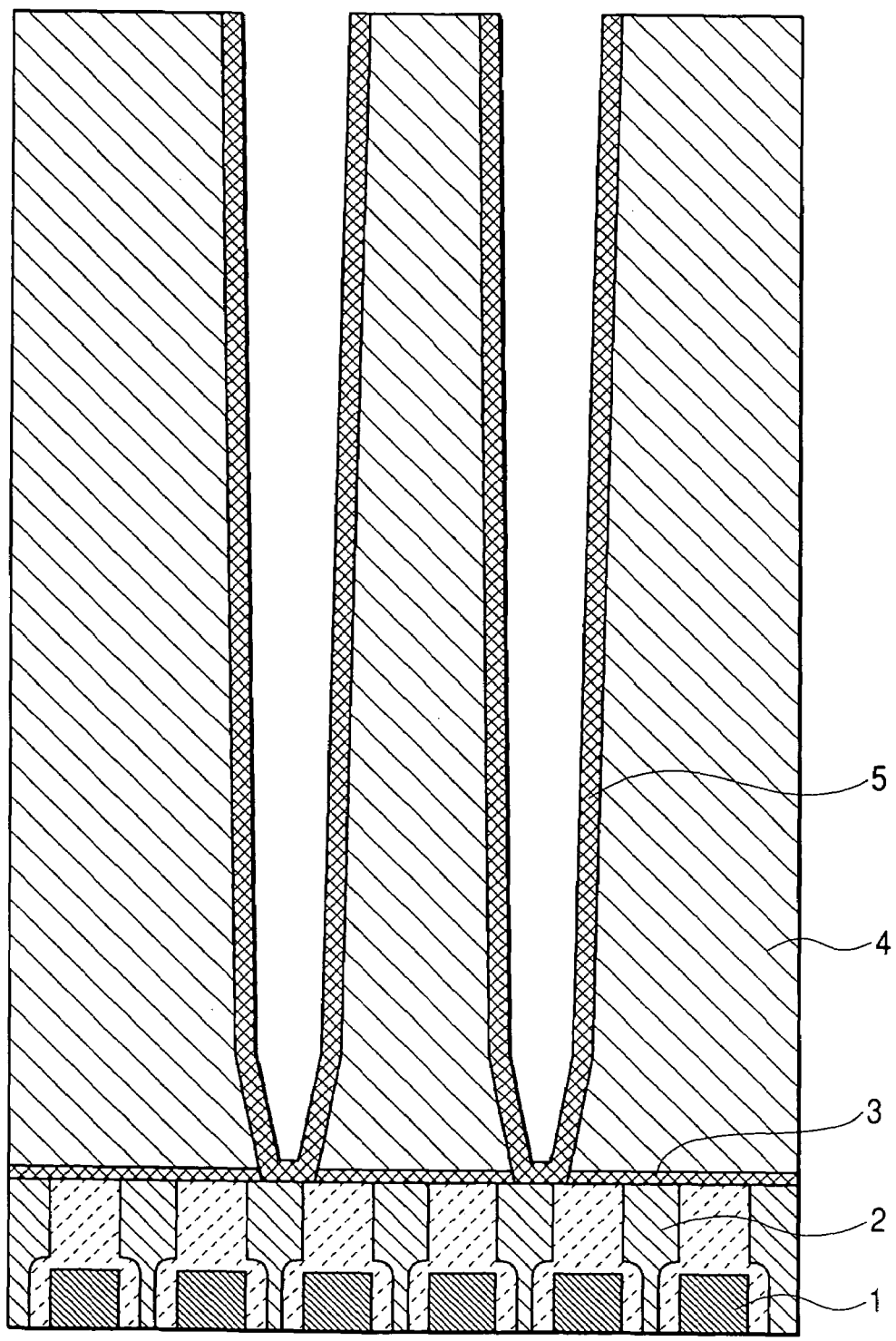
FIG. 15 is a cross-sectional construction view of a DRAM capacitor portion prepared according to Embodiment 1 of the present invention.
Figure 16:
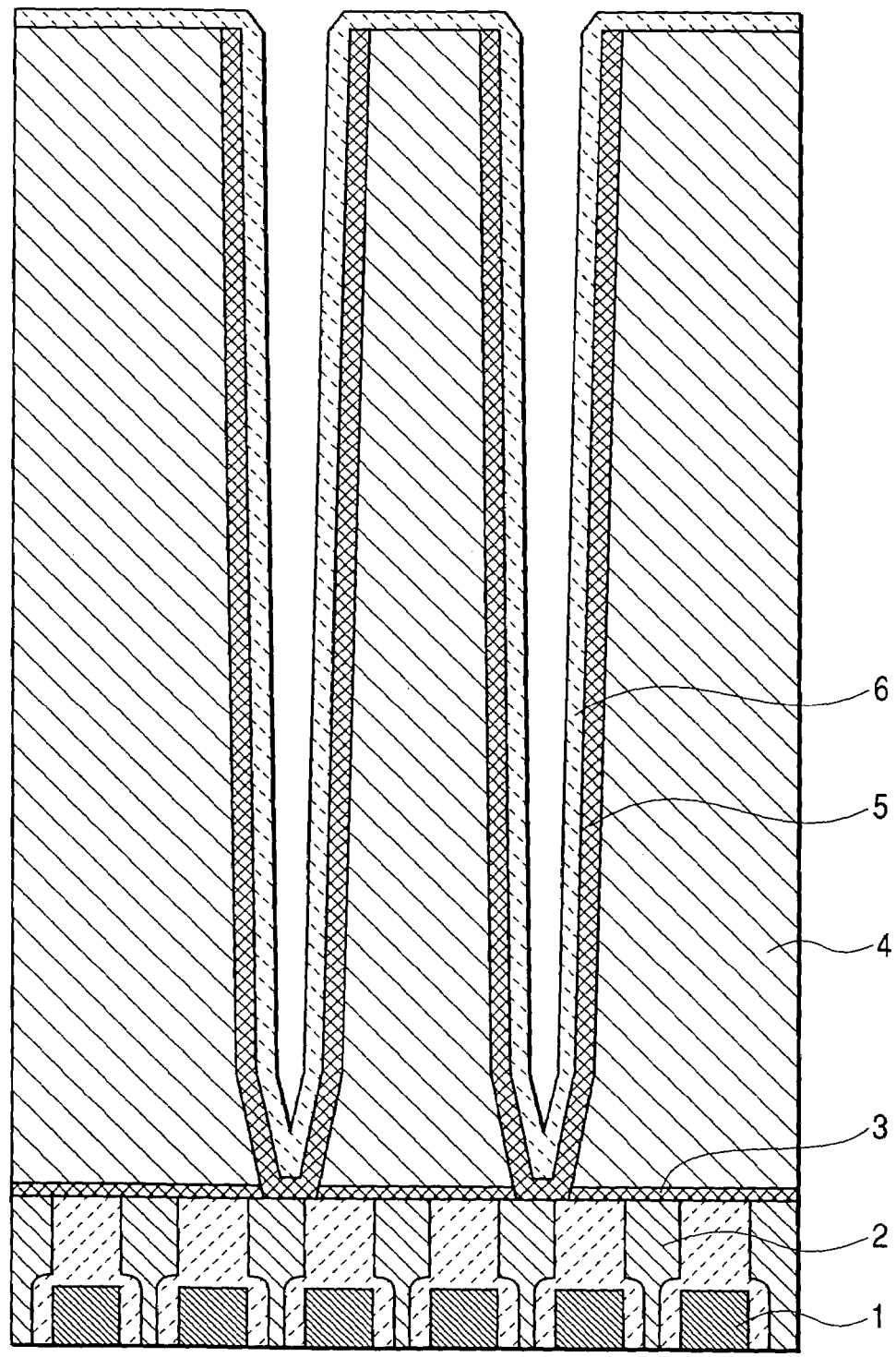
FIG. 16 is a cross-sectional construction view of a DRAM capacitor portion prepared according to Embodiment 1 of the present invention.
Figure 18:
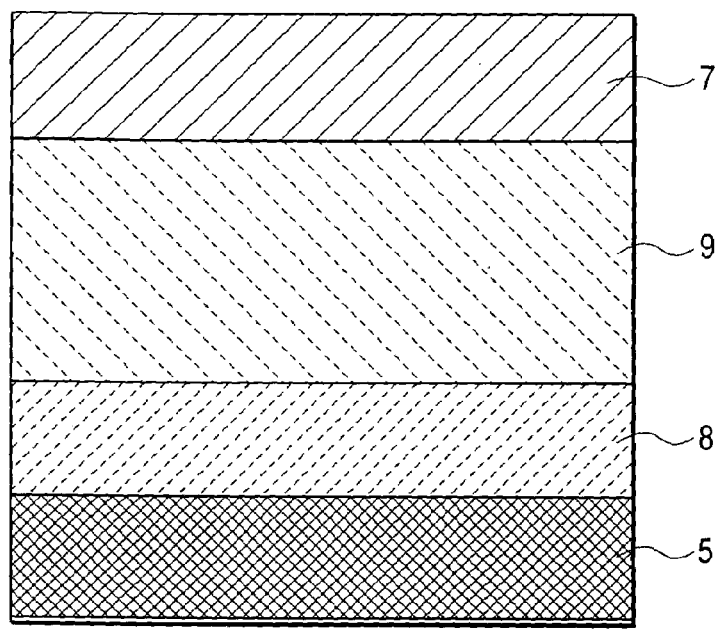
FIG. 18 is a construction view of a DRAM capacitor portion prepared according to Embodiment 1 of the present invention.

Further, as shown in FIG. 14, a phosphorus-doped poly-silicon film 5 is deposited to have a film thickness of about 35 nm, and as shown in FIG. 15, the poly-silicon film is separated for every bit by a well known etching back technique using a photo-resist film. A natural oxide film grows about 1.5 nm on the surface of the poly-silicon film as shown in FIG. 18 at the time of conveyance between apparatuses. Next, an $Al_2O_3$ film as a dielectric film 9 is formed on the natural oxide film. At that time, the following principle is used. As a forming method, an atomic layer deposition is used of which raw material is $Al(CH_3)_3$ and, $H_2O$ or $O_3$. A description will be made hereinafter using $H_2O$ as an example. Since $H_2O$ has an oxidizing action, oxidization of the surface further progresses. In this method, Al and O are alternately formed with four steps, i.e., pulse (flow) of $Al(CH_3)_3$, purge, pulse (flow) of $H_2O$, and purge as one cycle. Here, a description will be made of an $Al_2O_3$ film forming method having an oxygen loss caused by reduction of the pulse (flow) time of $H_2O$. The number of molecules adsorbed on the surface is proportional to a square of the $H_2O$ gas pulse (flow) time as shown in FIG. 2 because a pressure within a chamber increases proportional to the $H_2O$ gas pulse (flow) time. However, when a supply of $H_2O$ exceeds a certain quantity, the surface is covered with OH, and even if the gas pulse (flow) time is further increased, the ratio of oxygen in $Al_2O_3$ does not increase. Further, since a diffusion distance of oxygen atoms is about 3 nm, it corresponds to about 10 atomic layers. Therefore, to take in oxygen for one layer, the oxygen loss may be 1/10 in one atomic layer, that is, the ratio of oxygen in $Al_2O_3$ may be 54%. To reduce 10% of the number of molecules of $H_2O$ impinging upon the surface, it is desirable that the $H_2O$ gas pulse (flow) time be 80 to 90% of the conditions that $Al_2O_3$ of stoichiometric composition can be formed. However, the present procedure is applicable if the $H_2O$ pulse (flow) time is less than 100% of the forming conditions of stoichiometry composition. Further, as a method for introducing 10% of oxygen loss into $Al_2O_3$, a method for reducing the $H_2O$ flow rate is shown. It is desirable, to make the ratio of oxygen in $Al_2O_3$ 54%, to be 95 to 85% of the $H_2O$ flow rate that is able to form $Al_2O_3$ of stoichiometry composition as shown in FIG. 3.

Figure 4:
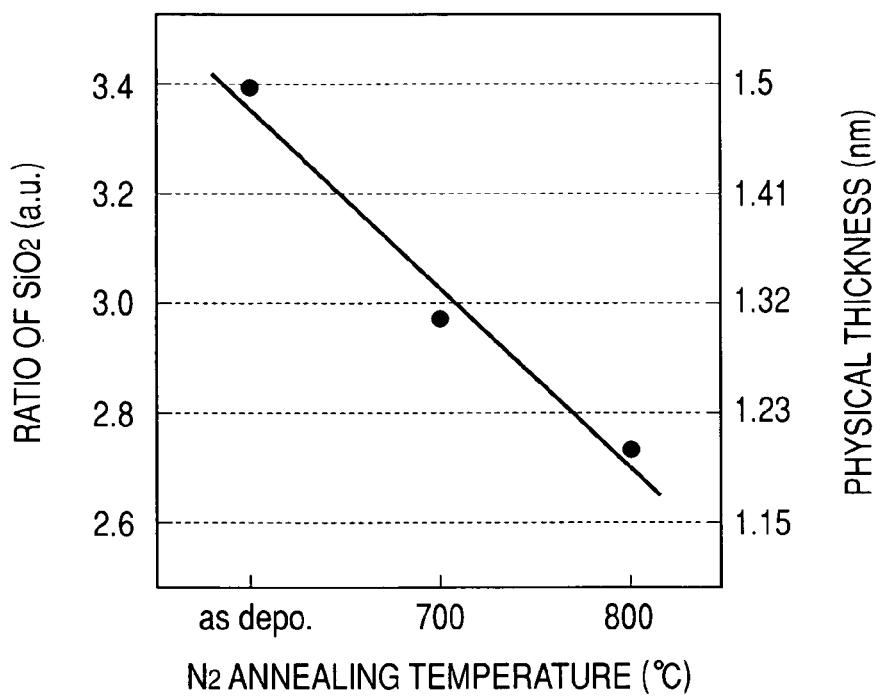
FIG. 4 shows a heat-treatment temperature dependence of a thickness of a natural dioxide film formed between an amorphous silicon and $Al_2O_3$ having an oxygen loss.
Figure 5:
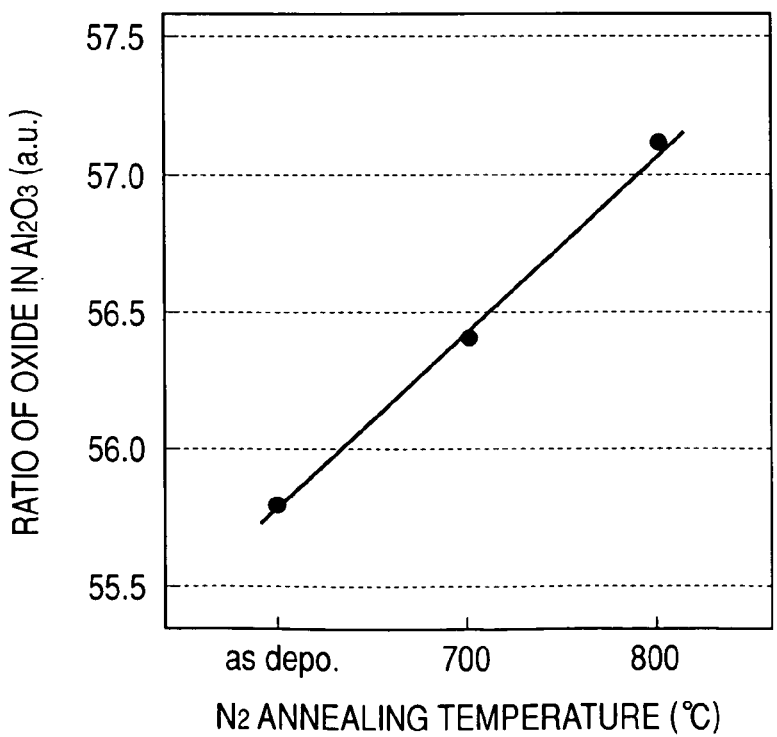
FIG. 5 shows a heat-treatment temperature dependence of the ratio of oxygen in $Al_2O_3$.
Figure 6:
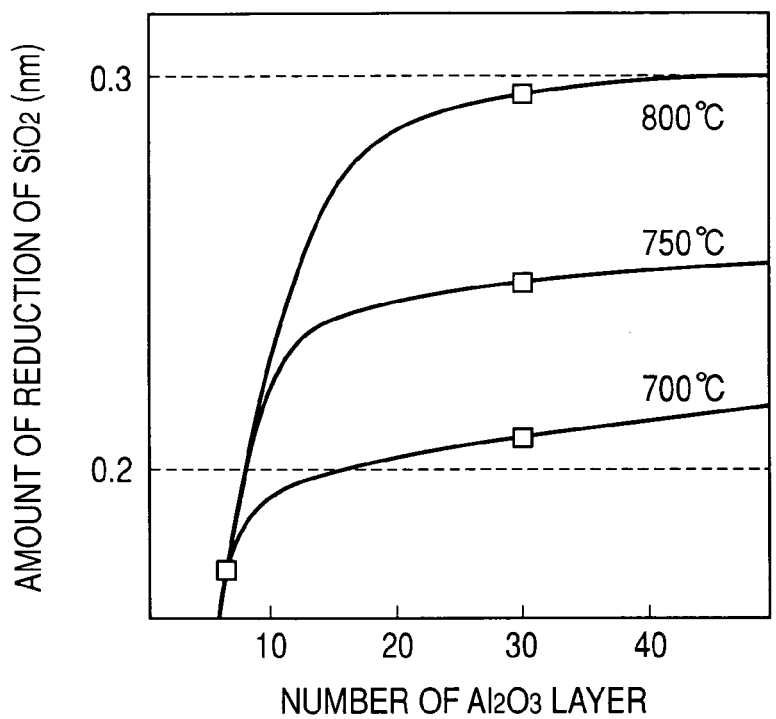
FIG. 6 shows a dependence of an amount of reduction of $SiO_2$ on a $Al_2O_3$ film thickness when a heat treatment temperature is changed.
Figure 17:
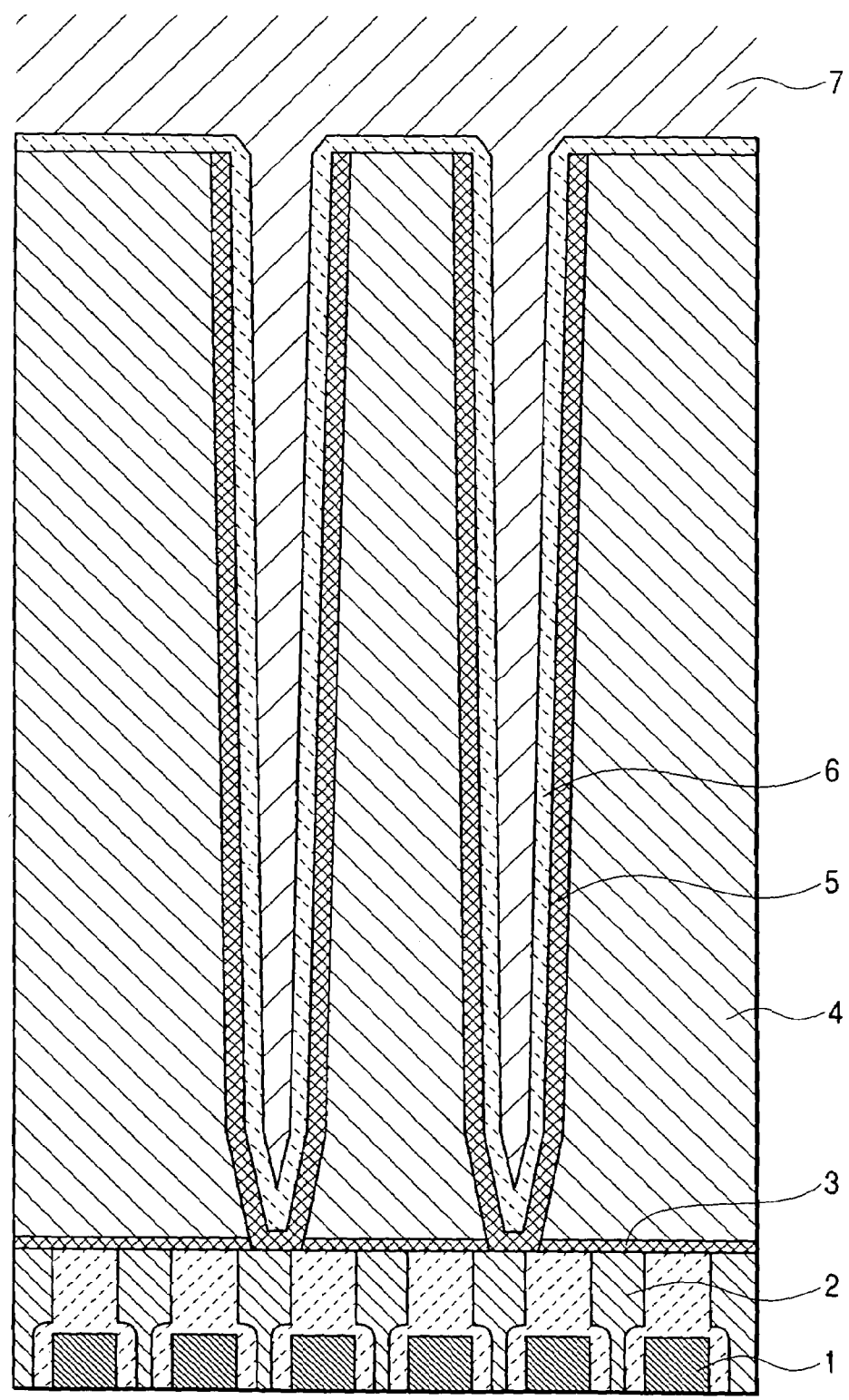
FIG. 17 is a cross-sectional construction view of a DRAM capacitor portion prepared according to Embodiment 1 of the present invention.
Figure 19:
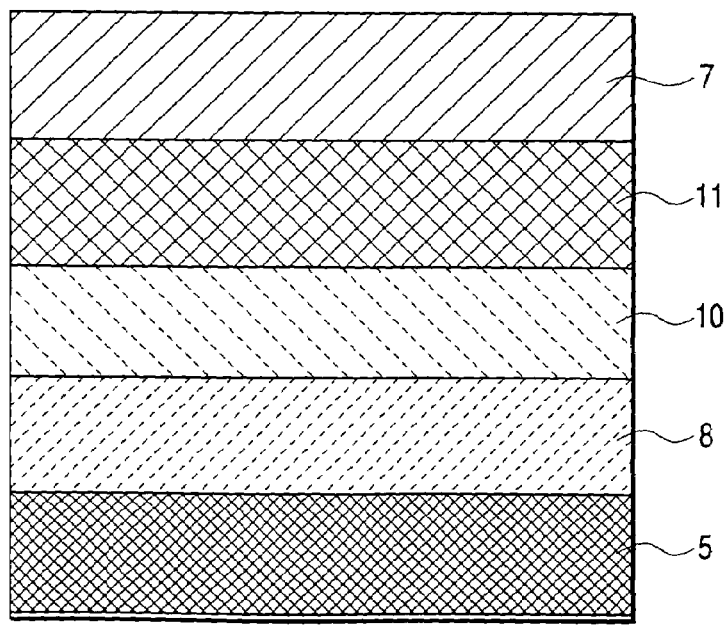
FIG. 19 is a construction view of a DRAM capacitor portion prepared according to Embodiment 1 of the present invention.
Figure 20:
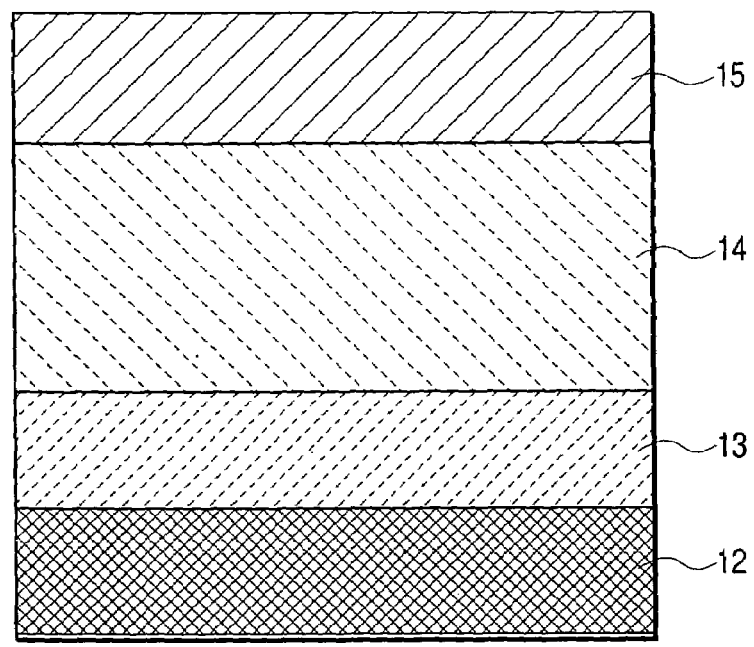
FIG. 20 is a construction view of a DRAM capacitor portion prepared according to Embodiment 2 of the present invention.
Figure 21:
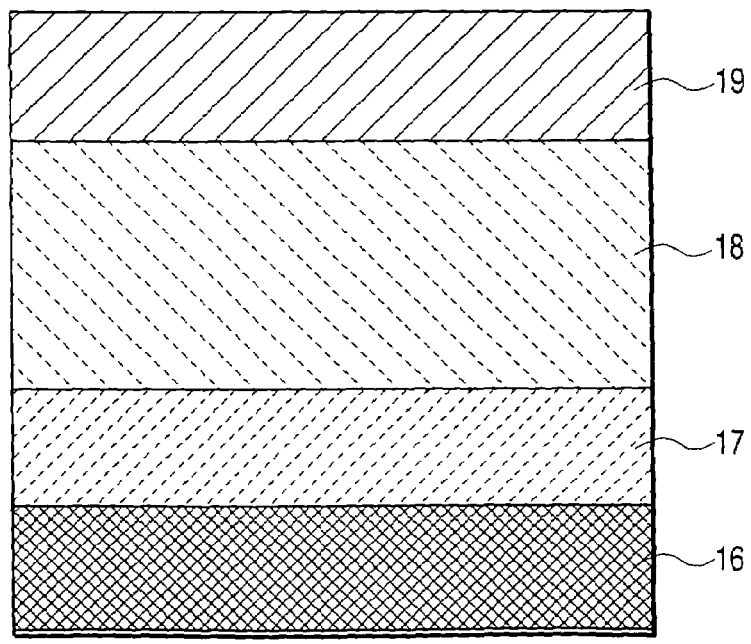
FIG. 21 is a construction view of a DRAM capacitor portion prepared according to Embodiment 3 of the present invention.
Figure 22:
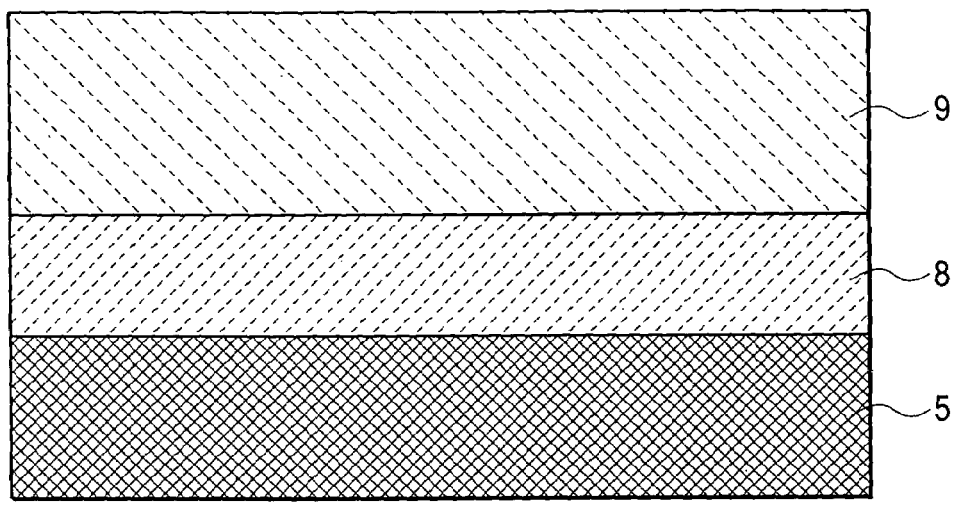
FIG. 22 is a construction view of a DRAM capacitor portion prepared according to Embodiment 1 of the present invention.
Figure 23:
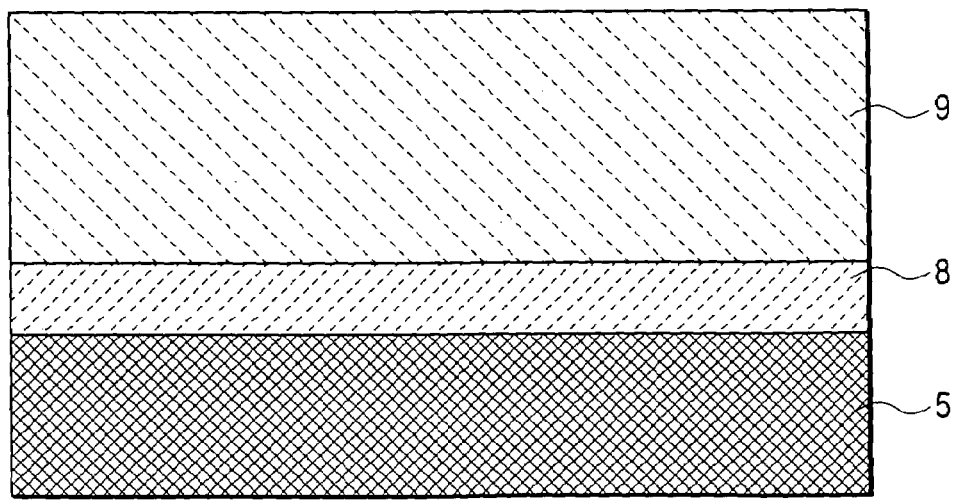
FIG. 23 is a construction view of a DRAM capacitor portion prepared by Embodiment 1 of the present invention.

However, the present procedure is applicable if the $H_2O$ flow rate is less than 100% of the forming conditions of stoichiometric composition. The present procedure is used to form $Al_2O_3$ having a thickness of 3 nm, after which heat treatment is carried out in the atmosphere of nitrogen. The XPS measurement result of samples is shown in FIG. 4. A section appears as in FIG. 22 prior to the heat treatment, but it is understood that as a heat-treatment temperature rises, the content of oxygen reduces. It is confirmed that a dioxide film is reduced by 0.2 nm at maximum as shown in FIG. 23. Further, FIG. 5 shows the ratio of oxygen in $Al_2O_3$ obtained by XPS. As a heat-treatment temperature rises, the content of oxygen increases. This is probably because oxygen in the dioxide film is taken into $Al_2O_3$. That is, $Al_2O_3$ which involves many oxygen losses reduces a dioxide film on the poly-silicon surface by heat treatment after formation, whereby oxygen atoms are taken into $Al_2O_3$. As shown in FIG. 19, heat treatment is carried out at about 700 to 800° C. in the atmosphere of an inert gas, oxygen or nitrous oxide after formation of $Al_2O_3$ as shown in FIG. 19 whereby oxygen in a dioxide film is taken into an insulator by the reduction action of an insulator including oxygen losses to reduce a thickness of the dioxide film. As a result, the thickness of an interfacial dioxide film equal to or less than 1.5 nm can be achieved first by using the present system. Here, the fact that a heat-treatment temperature is not 900° C. is because a reaction with a polysilicon underlayer occurs to generate a diffusion layer. FIG. 6 shows a relationship between the number of layers of $Al_2O_3$ and the thickness of a dioxide film to be reduced. As the film thickness of $Al_2O_3$ is increased, the thickness of a dioxide film to be reduced increases; however, in the film thickness in excess of diffusion distance of oxygen, the film thickness to be reduced will not increase further. Further, as a heat-treatment temperature is increased, the film thickness to be reduced increases; however, 800° C. is an upper limit by reason as previously mentioned. Finally, as shown in FIG. 17, a capacitor is completed by forming an upper electrode 7 of TiN by a spatter method. It is noted that the present method is applicable to a dielectric even using $HfO_2$, a mixed phase of $Al_2O_3$ and $HfO_2$, an $Al_2O_3/Ta_2O_5$ laminated film (10/11), $Ta_2O_5$, $TiO_2$, $ZrO_2$, $Y_2O_3$, $CeO_2$, and $La_2O_3$.

Embodiment 2

The present embodiment discloses a method of fabricating a memory capacitor of a DRAM having a capacitor according to the present invention. Bit lines 1 are formed by the same method as that of Embodiment 1, and a polysilicon film is separated for every bit by a well known etchback technique using a photoresist film as shown in FIG. 15. At the time of conveyance between apparatuses, a natural dioxide film 13 grows to about 1.5 nm on the surface of a polysilicon film 12. Next, a $HfO_2$ film 14 is formed as a dielectric film on the natural dioxide film. At that time, the following principle is used. As a forming method, there is used an atomic layer deposition of which raw material is $HfCl_4$ or hafnium halogen compound and, $H_2O$ or $H_2O_2$ or $O_3$. A description will be made hereinafter referring to $HfCl_4$ and $H_2O$ as an example. Since $H_2O$ has an oxidizing action, oxidization of the surface further progresses. In this method, Hf and O are alternately formed with four steps, i.e., pulse (flow) of $HfCl_4$, purge, pulse (flow) of $H_2O$, and purge as one cycle. Here, the pulse (flow) time of $H_2O$ is shortened to thereby form $HfO_2$ having an oxygen loss. For the same reason as in Embodiment 1, the $H_2O$ pulse (flow) time is made to be 90 to 80% of the conditions that can form $HfO_2$ of the stoichiometry composition, or the $H_2O$ flow rate is made to be 95 to 85% of the conditions that can form $HfO_2$ of the stoichiometry composition whereby $HfO_2$ including an oxygen loss of about 10% can be formed. Thereafter, heat treatment is carried out in the atmosphere of an inert gas, oxygen or nitrous oxide, whereby oxygen in a dioxide film is taken into a dielectric film by the reduction action of a dielectric film including an oxygen loss to reduce a thickness of a dioxide film. Finally, an upper electrode 15 of TiN is formed by a sputtering method to complete a capacitor.

Embodiment 3

Figure 7:
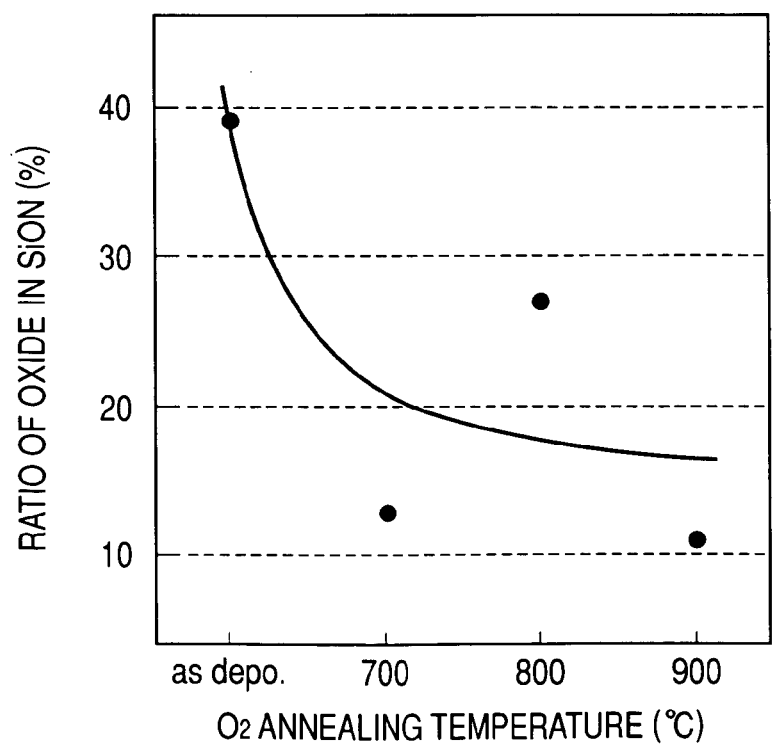
FIG. 7 shows a dependence of the ratio of oxygen in SiON on a heat treatment temperature.
Figure 8:
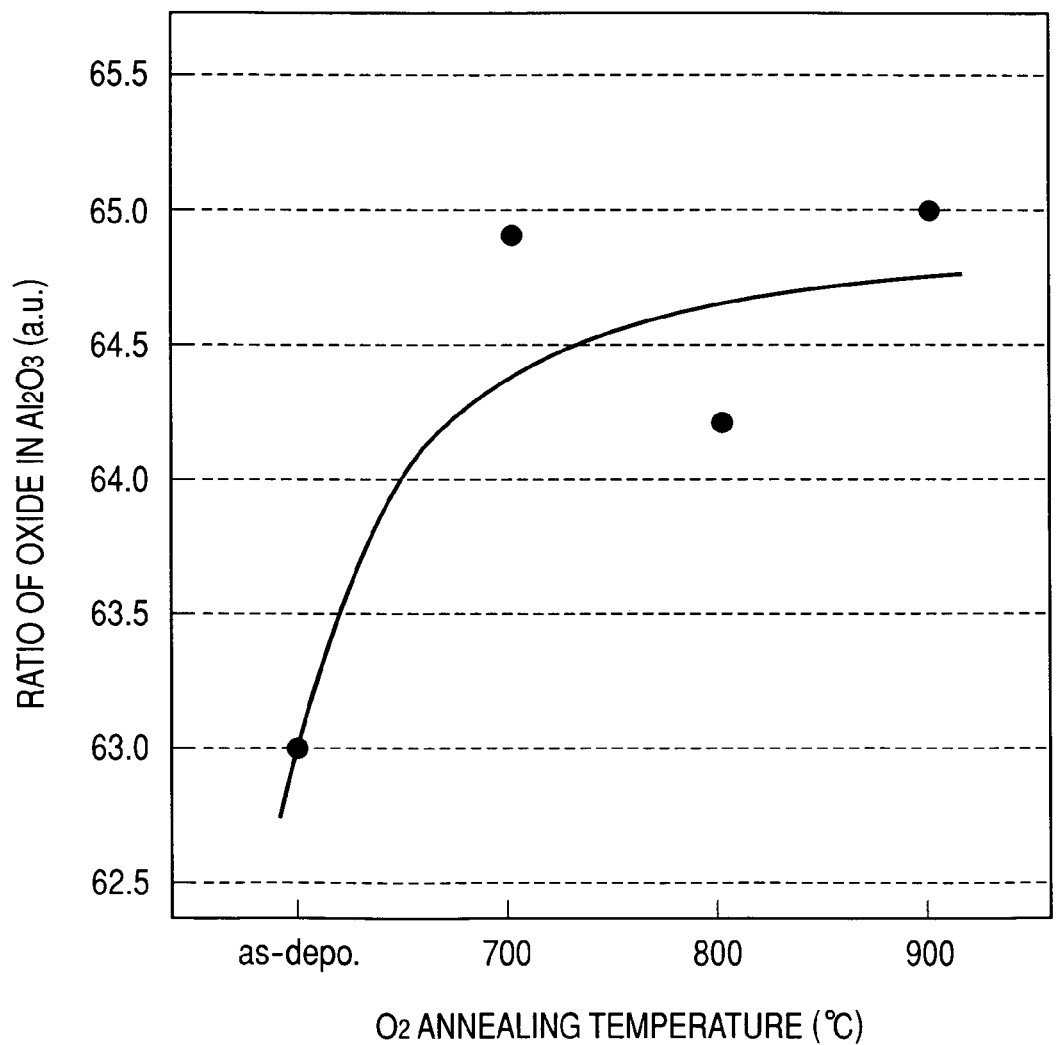
FIG. 8 shows a dependence of the ratio of oxygen in $Al_2O_3$ on a heat treatment temperature.

The present embodiment discloses a method of fabricating a memory capacitor of a DRAM having a capacitor according to the present invention. A lower electrode 16 formed of polysilicon from bit lines is prepared by the same method as in Embodiment 1. Next, a heat nitride treatment is carried out using $NH_3$ to form a nitride silicon film on the surface of a lower electrode. It is noted that about 40% of oxygen is introduced into nitrogen at the time of conveyance between apparatuses to obtain a SiON film 17. Next, as a dielectric film, a dielectric film $Al_2O_3$ 18 including an oxygen loss is formed by the same method as in Embodiment 1. Further, a heat treatment is carried out in the atmosphere of nitrous oxide whereby oxygen in a SiON film is taken into a dielectric film by the reduction action of a dielectric film including an oxygen loss to reduce the ratio of oxygen in SiON. This behavior is shown in FIG. 7 as the result of the verification using XPS. The figure shows that the ratio of oxygen in SiON is reduced as a heat-treatment temperature in oxygen rises. By the heat treatment at 700° C., the oxygen concentration that has been 40% is dropped down to about 10%. Further, FIG. 8 shows that the oxygen concentration in $Al_2O_3$ increases as a heat-treatment temperature rises. This indicates that oxygen in SiON is taken into $Al_2O_3$. Finally, an upper electrode 19 is formed of TiN through a spattering method. It is noted that the present method is applicable to a dielectric even using $Al_2O_3$, $HfO_2$, a mixed phase of $Al_2O_3$ and $HfO_2$, $Al_2O_3/Ta_2O_5$, $Ta_2O_5$, $TiO_2$, $ZrO_2$, $Y_2O_3$, $CeO_2$, or $Al_2O_3$.

Embodiment 4

Figure 24:
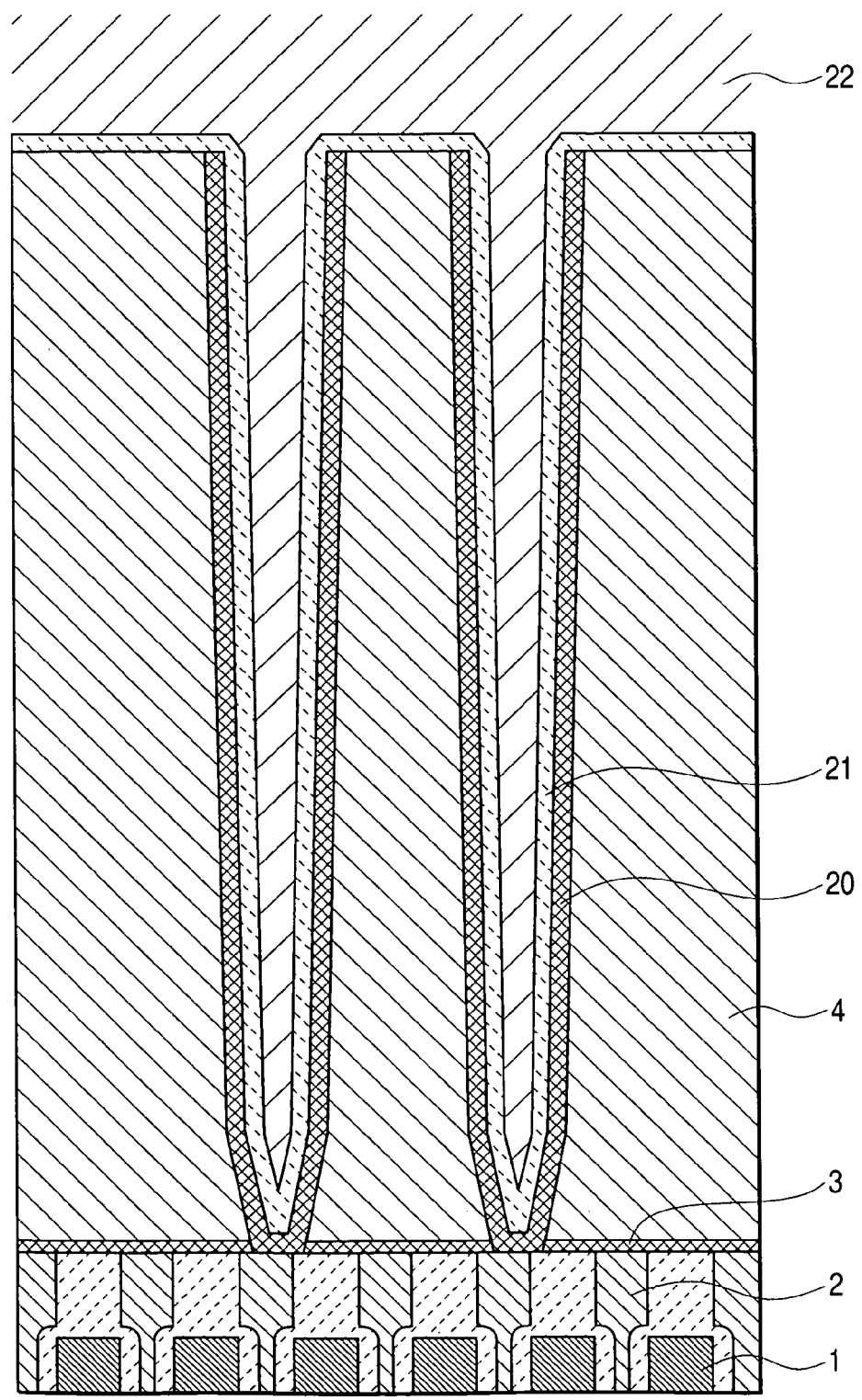
FIG. 24 is a cross-sectional construction view of a DRAM capacitor portion prepared according to Embodiment 4 of the present invention.

The present embodiment discloses a method of fabricating a memory capacitor of a DRAM having a capacitor according to the present invention. The procedure from the formation of bit lines to that of grooves for lower electrodes above poly-silicon plugs is carried out by the same method as in Embodiment 1. Next, a Ru film 20 of a lower electrode is formed by a heat CVD method of which raw material is $Ru(EtCp)_2$ in the atmosphere of oxygen, and the Ru film is separated for every bit by a well known etchback method. It is noted that the Ru surface is oxidized about 1 nm at the time of conveyance between apparatuses to form $RuO_4$. Next, a $Al_2O_3$ film 21 is formed on the Ru film by the same method as in Embodiment 1. Next, a heat treatment is carried out in the atmosphere of an inert gas, oxygen or nitrous oxide whereby oxygen in Ru is taken into a dielectric film by the reduction action of a dielectric film including an oxygen loss to reduce a thickness of a $RuO_4$ film. Finally, a Ru film 22 of an upper electrode is formed by the same method as that for the lower electrode. FIG. 24 is a sectional view of the device prepared by the present process. It is noted that the present method is applicable to a dielectric film even using $Al_2O_3$, $HfO_2$, a mixed phase of $Al_2O_3$ and $HfO_2$, $Al_2O_3/Ta_2O_5$, $Ta_2O_5$, $TiO_2$, $ZrO_2$, $Y_2O_3$, $CeO_2$, or $La_2O_3$.

Embodiment 5

Figure 25:
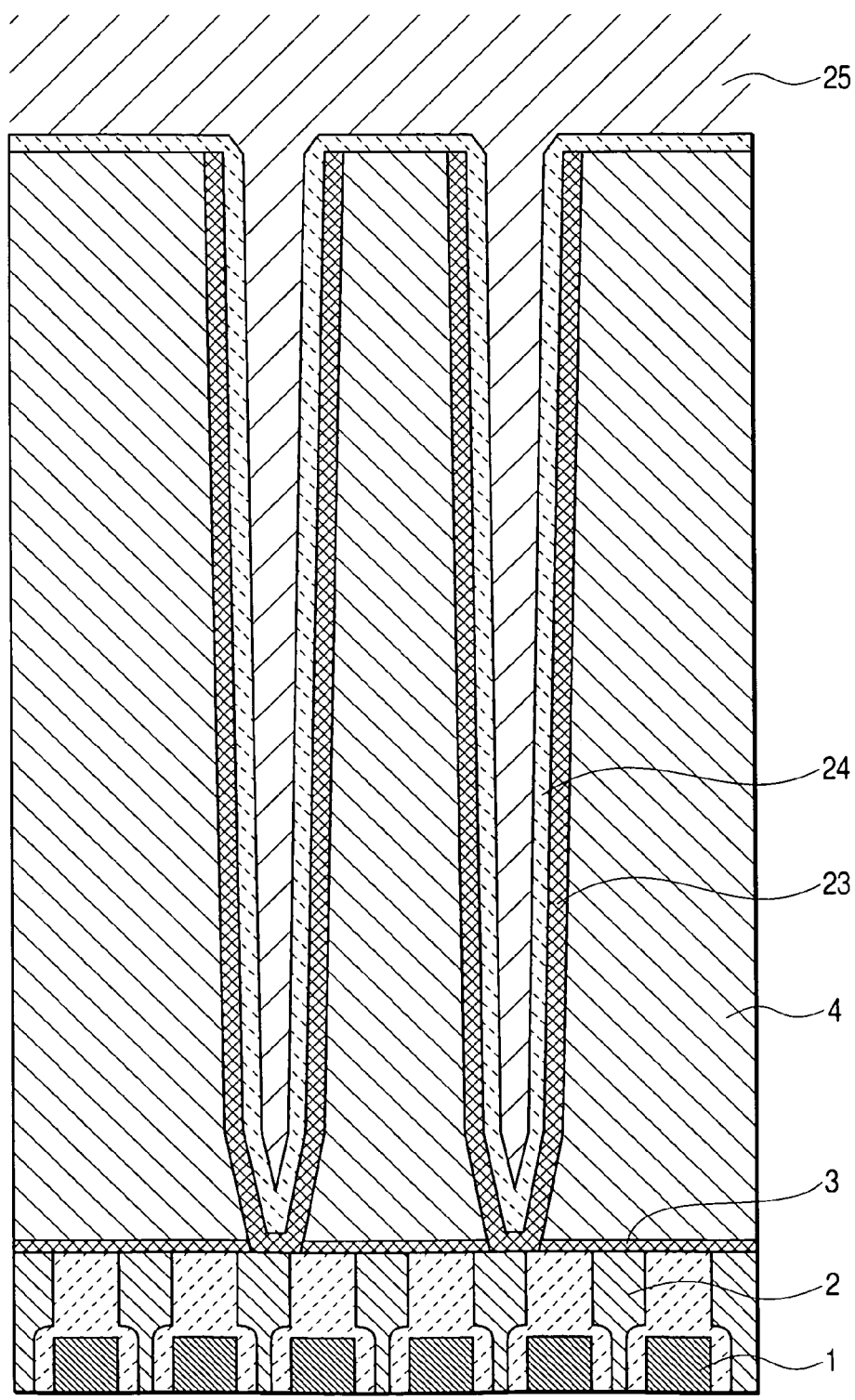
FIG. 25 is a cross-sectional construction view of a DRAM capacitor portion prepared according to Embodiment 5 of the present invention.

The present embodiment discloses a method of fabricating a memory capacitor of a DRAM having a capacitor according to the present invention. The procedure from the formation of bit lines to the formation of grooves for a lower electrode above poly-silicon plugs is carried out by the same method as in Embodiment 1. Next, a lower electrode of W is formed by a spatter method, and the lower electrode 23 is separated for every bit by a well known etchback method using a photoresist film. It is noted that the W surface is oxidized about 1 nm at the time of conveyance between devices. A dielectric film $Al_2O_3$ 24 is formed on the lower electrode by the same method as in Embodiment 1. Further, a heat treatment is carried out in the atmosphere of an inert gas, oxygen or nitrous oxide whereby oxygen in $WO_2$ is taken into a dielectric film by the reduction action of a dielectric to reduce $WO_2$. Finally, an upper electrode of W 25 is formed by the same method as for the lower electrode. FIG. 25 is a cross-sectional view of the device prepared by the present processes. It is noted that the present procedure is applicable to a lower and an upper electrode formed of even such a material as Pt, Ti, Cu or the like. Further, The present method is applicable to a dielectric film even using $Al_2O_3$, $HfO_2$, a mixed phase of $Al_2O_3$ and $HfO_2$, $Al_2O_3/Ta_2O_5$, $Ta_2O_5$, $TiO_2$, $ZrO_2$, $Y_2O_3$, $CeO_2$, or $La_2O_3$.

Embodiment 6

Figure 26:
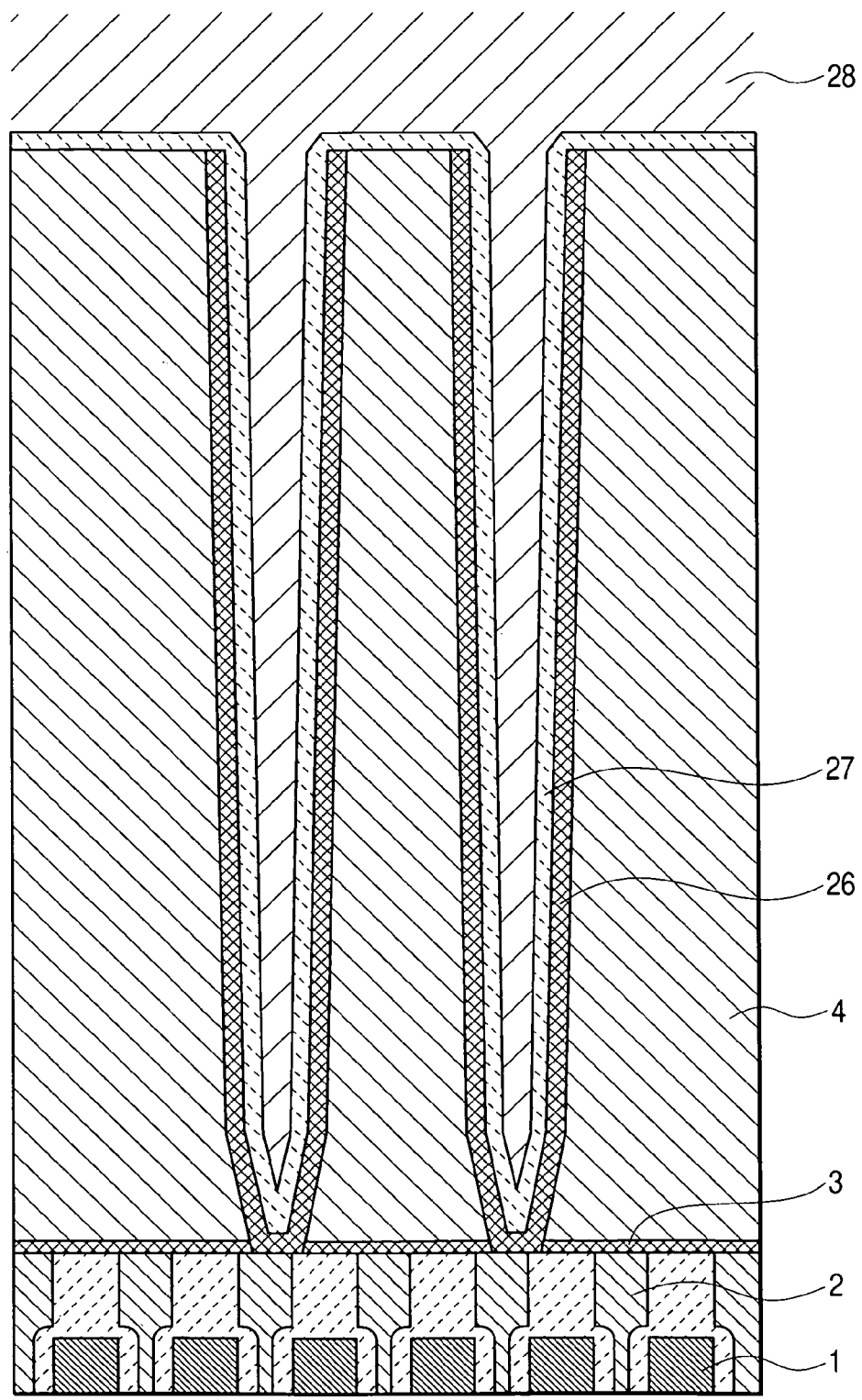
FIG. 26 is a cross-sectional construction view of a DRAM capacitor portion prepared according to Embodiment 6 of the present invention.

The present embodiment discloses a method of fabricating a memory capacitor of a DRAM having a capacitor according to the present invention. The procedure from the formation of bit lines to the formation of grooves for a lower electrode above poly-silicon plugs is carried out by the same method as in Embodiment 1. Next, a TiN film 26 of a lower electrode is formed by a heat CVD method of which raw material is TiCl and $NH_3$ or a spatter method, and the TiN film is separated for every bit by a well known etchback technique. It is noted that the $TiO_2$ film is formed to have a film thickness of about 0.3 nm on the TiN surface at the time of conveyance between apparatuses. Next, a dielectric film $Al_2O_3$ 27 is formed on the TiN film by a method similar to Embodiment 1. At this time, since oxidative $H_2O$ is used, oxidization of the TiN film further progresses according to a forming temperature. Further, a heat treatment is carried out in the atmosphere of an inert gas, oxygen or nitrous oxide whereby oxygen in $TiO_2$ is taken into the dielectric film by the reduction action of a dielectric to reduce $TiO_2$. Finally, a TiN film 28 of an upper electrode is formed by the same method as for the lower electrode. A sectional view of the device prepared by the present process is shown in FIG. 26. It is noted that the present method is applicable to a dielectric film even using $Al_2O_3$, $HfO_2$, a mixed phase of $Al_2O_3$ and $HfO_2$, $Al_2O_3/Ta_2O_5$, $Ta_2O_5$, $TiO_2$, $ZrO_2$, $Y_2O_3$, $CeO_2$, or $La_2O_3$.

Embodiment 7

Figure 27:
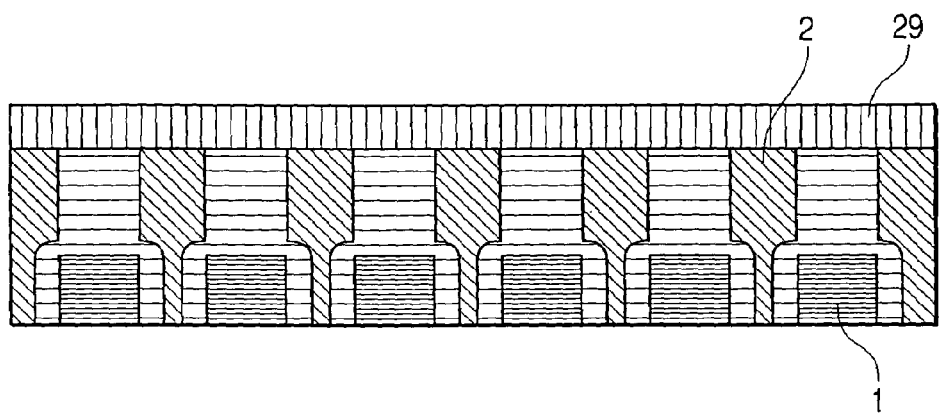
FIG. 27 is a cross-sectional construction view of a DRAM capacitor portion prepared according to Embodiment 7 of the present invention.
Figure 28:
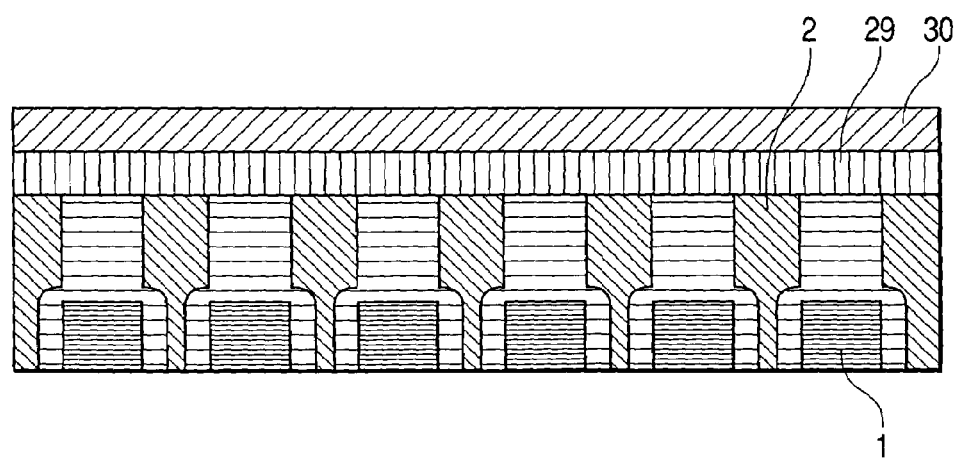
FIG. 28 is a cross-sectional construction view of a DRAM capacitor portion prepared according to Embodiment 7 of the present invention.
Figure 29:
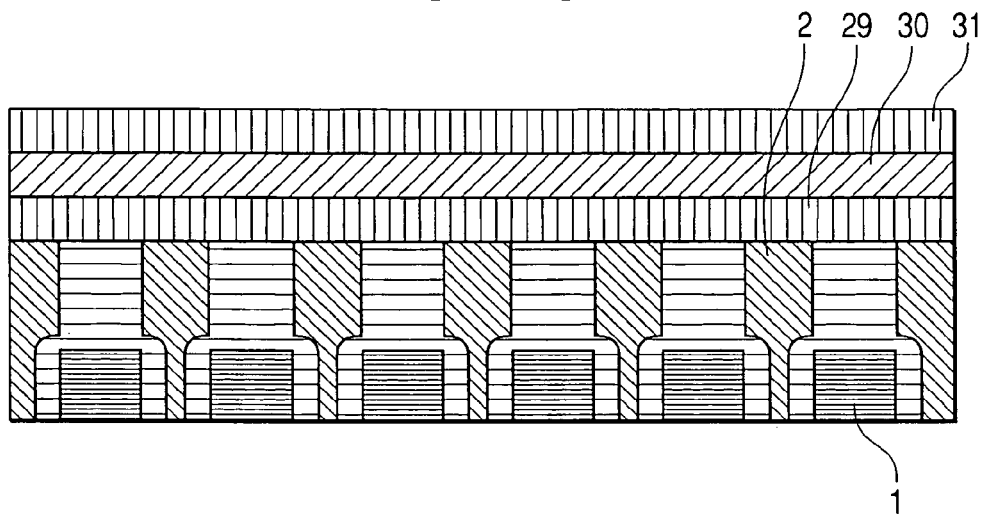
FIG. 29 is a cross-sectional construction view of a DRAM capacitor portion prepared according to Embodiment 7 of the present invention.
Figure 30:
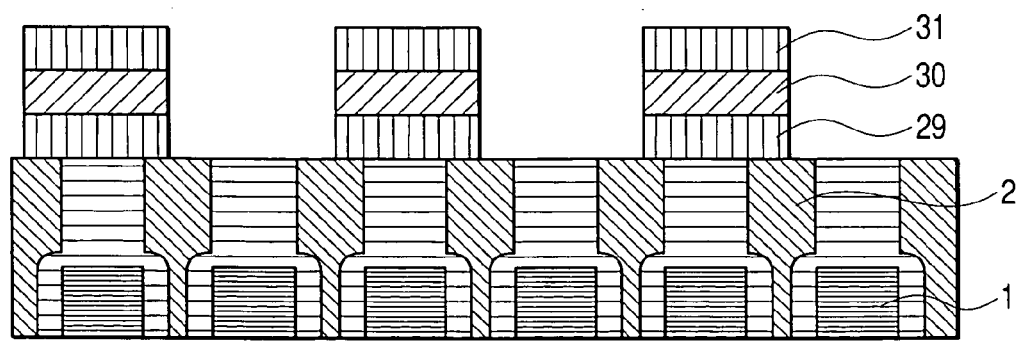
FIG. 30 is a cross-sectional construction view of a DRAM capacitor portion prepared by Embodiment 7 of the present invention.

The present embodiment discloses a method of fabricating a ferroelectric memory capacitor having a capacitor according to the present invention. Bit lines 1 are formed on a memory cell selective transistor formed by a well known method, and plugs 2 for electrically connecting a selective transistor with a capacitor is formed. A ferroelectric capacitor is prepared above the plug using a sol-gel method. A lower electrode 29 is formed of Pt as shown in FIG. 27. The surface of the Pt film is oxidized during conveyance between apparatuses to form $PtO_2$. Then, a PZT film 30, a ferroelectric substance, is formed as shown in FIG. 28. Further, a crystallization heat treatment at 700° C. is carried out in the atmosphere of oxygen. At the time of the crystallized heat treatment, a film thickness of the $PtO_2$ film on the surface of a lower electrode is reduced due to the reduction action of PZT. Next, an upper electrode 31 is formed using Pt by a spatter method as shown in FIG. 29. Finally, a capacitor is separated for every bit by dry etching as shown in FIG. 30.

It is noted that a description of reference numerals used in the drawings of the present application is as follows:

1 . . . Bit line,
2 . . . Polysilicon plug,
3 . . . Nitride silicon film,
4 . . . Silicon dioxide film,
5 . . . Polysilicon film,
6 . . . Insulator,
7 . . . Upper electrode,
8 . . . Natural oxide film,
9 . . . Dielectric film,
10 . . . $Al_2O_3$,
11 . . . $Ta_2O_5$,
12 . . . Polysilicon,
13 . . . Natural oxide film,
14 . . . $HfO_2$,
15 . . . Upper electrode,
16 . . . Lower electrode,
17 . . . SiON,
18 . . . $Al_2O_3$,
19 . . . Upper electrode,
20 . . . Ru lower electrode,
21 . . . $Al_2O_3$,
22 . . . Upper electrode,
23 . . . Lower electrode,
24 . . . $Al_2O_3$,
25 . . . W,
26 . . . TiN lower electrode,
27 . . . $Al_2O_3$,
28 . . . TiN upper electrode,
29 . . . Pt lower electrode,
30 . . . PZT,
31 . . . Pt upper electrode.

What is claimed is:

1. A method for fabricating a semiconductor device including a memory cell comprising a memory cell-selecting transistor formed on a semiconductor substrate and an information-accumulating capacitor electrically connected in series with said memory cell-selecting transistor and formed on said semiconductor substrate, said method comprising the steps of:

forming said memory cell-selecting transistor on said semiconductor substrate, thereafter depositing insulators on a region including said memory cell-selecting transistor, and forming a groove in a portion on which said information-accumulating capacitor is to be formed through opening of said insulators by etching;

forming a lower electrode formed of phosphorous-doped polysilicon on the surface of an inner wall of said groove;

forming, through a silicon dioxide thin film formed with a part of said lower electrode oxidized, a dielectric film comprising a metal oxide film having a higher dielectric constant than said silicon dioxide film on the surface of said lower electrode by a deposition method using a condition that a content of oxygen in said dielectric film is less than an amount of a stoichiometric composition of said dielectric film;

heat treating said semiconductor substrate in the atmosphere of an inert gas, oxygen or nitrous oxide thereby reducing said silicon dioxide thin film and taking oxygen in said silicon dioxide thin film into said dielectric film;

depositing a material to be an upper electrode so as to burry the interior of said groove;

wherein said dielectric film is an $Al_2O_3$ film formed by an atomic layer deposition which uses, as a raw material, an organic aluminum compound and an oxide gas, and introduces the organic aluminum compound and the oxide gas alternately into a reactor every predetermined time to thereby form a film; and wherein at the time of forming a film according to said atomic layer deposition, a pulse (flow) time of said $H_2O$ is reduced to about 90 to 80% of a pulse (flow) time capable of forming $Al_2O_3$ of a stoichiometric composition to thereby generate an oxygen loss of about 10% in said $Al_2O_3$.

2. A method for fabricating a semiconductor device according to claim 1, wherein said dielectric film is an $Al_2O_3$ film formed by an atomic layer deposition which uses, as a raw material, an organic aluminum compound comprising $Al(CH_3)_3$, or $Al(CH_3)_2Cl$ and an oxide gas, and introduces the organic aluminum compound and the oxide gas alternately into a reactor every predetermined time to thereby form a film.

3. A method for fabricating a semiconductor device according to claim 1, wherein said dielectric film is an $Al_2O_3$ film formed by an atomic layer deposition which uses, as a raw material, an organic aluminum compound comprising $Al(CH_3)_3$, $H_2O$, and an oxide gas of either $O_3$ or $H_2O_2$, and introduces the organic aluminum compound, $H_2O$ and the oxide gas alternately into a reactor every predetermined time to thereby form a film.

4. A method for fabricating a semiconductor device including a memory cell comprising a memory cell-selecting transistor formed on a semiconductor substrate and an information-accumulating capacitor electrically connected in series with said memory cell-selecting transistor and formed on said semiconductor substrate, said method comprising the steps of:

forming said memory cell-selecting transistor on said semiconductor substrate, thereafter depositing insulators on a region including said memory cell-selecting transistor, and forming a groove in a portion on which said information-accumulating capacitor is to be formed through opening of said insulators by etching;

forming a lower electrode formed of phosphorous-doped polysilicon on the surface of an inner wall of said groove;

forming, through a silicon dioxide thin film formed with a part of said lower electrode oxidized, a dielectric film comprising a metal oxide film having a higher dielectric constant than a silicon dioxide film on the surface of said lower electrode by a deposition method using a condition that a content of oxygen in said dielectric film is less than an amount of a stoichiometric composition of said dielectric film;

heat treating said semiconductor substrate in the atmosphere of an inert gas, oxygen or nitrous oxide thereby reducing said silicon dioxide thin film and taking oxygen in said silicon dioxide thin film into said dielectric film;

depositing a material to be an upper electrode so as to burry the interior of said groove;

wherein said dielectric film is an $Al_2O_3$ film formed by an atomic layer deposition which uses, as a raw material, an organic aluminum compound and an oxide gas, and introduces the organic aluminum compound and the oxide gas alternately into a reactor every predetermined time to thereby form a film; and wherein at the time of forming a film according to said atomic layer deposition, a flow rate of said $H_2O$ is reduced to about 95 to 85% of a flow rate capable of forming $Al_2O_3$ of a stoichiometry composition to thereby generate an oxygen loss of about 10% in said $Al_2O_3$.

5. A method for fabricating a semiconductor device according to claim 4, wherein said dielectric film is an $Al_2O_3$ film formed by an atomic layer deposition which uses, as a raw material, an organic aluminum compound comprising $Al(CH_3)_3$, or $Al(CH_3)_2Cl$ and an oxide gas, snf introduces the organic aluminum compound ans the oxide gas alternately into a reactor every predetermined time to thereby form a film.

6. A method for fabricating a semiconductor device according to claim 4, wherein said dielectric film is an $Al_2O_3$ film formed by an atomic layer deposition which uses, as a raw material, an organic aluminum compound comprising $Al(CH_3)_3$, $H_2O$, and an oxide gas of either $O_3$ or $H_2O_2$, and introduces the organic aluminum compound, $H_2O$ and the oxide gas alternately into a reactor every predetermined time to thereby form a film.

7. A method for fabricating a semiconductor device including a memory cell comprising a memory cell-selecting transistor formed on a semiconductor substrate and an information-accumulating capacitor electrically connected in series with said memory cell-selecting transistor and formed on said semiconductor substrate, said method comprising the steps of:

forming said memory cell-selecting transistor on said semiconductor substrate, thereafter depositing insulators on a region including said memory cell-selecting transistor, and forming a groove in a portion on which said information-accumulating capacitor is to be formed through opening of said insulators by etching;

forming a lower electrode formed of phosphorous-doped polysilicon on the surface of an inner wall of said groove;

forming, through a silicon dioxide thin film formed with a part of said lower electrode oxidized, a dielectric film comprising a metal oxide film having a higher dielectric constant than a silicon dioxide film on the surface of said lower electrode by a deposition method using a condition that a content of oxygen in said dielectric film is less than an amount of a stoichiometric composition of said dielectric film;

heat treating said semiconductor substrate in the atmosphere of an inert gas, oxygen or nitrous oxide thereby reducing said silicon dioxide thin film and taking oxygen in said silicon dioxide thin film into said dielectric film;

depositing a material to be an upper electrode so as to burry the interior of said groove;

wherein said dielectric film is an $Al_2O_3$ film formed by an atomic layer deposition which uses, as a raw material, an organic aluminum compound and an oxide gas, and introduces the organic aluminum compound and the oxide gas alternately into a reactor every predetermined time to thereby form a film;

wherein at the time of forming a film according to said atomic layer deposition, a pulse (flow) time of said $H_2O$ is reduced to about 90 to 80% of a pulse (flow) time capable of forming $HfO_2$ of a stoichiometric composition to thereby generate an oxygen loss of about 10% in said $HfO_2$ film; and wherein said dielectric film is a $HfO_2$ film formed by an atomic layer deposition which uses, as a raw material, an organic hafnium and an oxide gas.

8. A method for fabricating a semiconductor device according to claim 7, wherein said dielectric film is a $HfO_2$ film formed by an atomic layer deposition which uses, as a raw material, $HfCl_4$, or an organic hafnium compound comprising a hafnium halogen compound and an ocide gas.

9. A method for fabricating a semiconductor device according to claim 7, wherein said dielectric film is a $HfO_2$ film formed by an atomic layer deposition which uses, as a raw material, an organic hafnium compound, $H_2O$, and an oxide gas either $O_3$ or $H_2O_2$.

10. A method for fabricating a semiconductor device including a memory cell comprising a memory cell-selecting transistor formed on a semiconductor substrate and an information-accumulating capacitor electrically connected in series with said memory cell-selecting transistor and formed on said semiconductor substrate, said method comprising the steps of:

forming said memory cell-selecting transistor on said semiconductor substrate, thereafter depositing insulators on a region including said memory cell-selecting transistor, and forming a groove in a portion on which said information-accumulating capacitor is to be formed through opening of said insulators by etching;

forming a lower electrode formed of phosphorous-doped polysilicon on the surface of an inner wall of said groove;

forming, through a silicon dioxide thin film formed with a part of said lower electrode oxidized, a dielectric film comprising a metal oxide film having a higher dielectric constant than a silicon dioxide film on the surface of said lower electrode by a deposition method using a condition that a content of oxygen in said dielectric film is less than an amount of a stoichiometric composition of said dielectric film;

heat treating said semiconductor substrate in the atmosphere of an inert gas, oxygen or nitrous oxide thereby reducing said silicon dioxide thin film and taking oxygen in said silicon dioxide thin film into said dielectric film;

depositing a material to be an upper electrode so as to burry the interior of said groove;

wherein said dielectric film is a $HfO_2$ film formed by an atomic layer deposition which uses, as a raw material, an organic hafnium and an oxide gas; and, wherein at the time of forming a film according to said atomic layer deposition, a flow rate of said $H_2O$ is reduced to about 95 to 85% of a flow rate capable of forming $HfO_2$ of a stoichiometric composition to thereby generate an oxygen loss of about 10% in said $HfO_2$.

11. A method for fabricating a semiconductor device according to claim 10, wherein said dielectric film is a $HfO_2$ film formed by an atomic layer deposition which uses, as a raw material, $HfCl_4$, or an organic aluminum compound comprising a hafnium halogen compound and an oxide gas.

12. A method for fabricating a semiconductor device according to claim 10, wherein said dielectric film is a $HfO_2$ film formed by an atomic layer deposition which uses, as a raw material, an organic hafnium compound, $H_2O$, and an oxide gas either $O_3$ or $H_2O_2$.

* * * * *